(12) United States Patent
Chen

(10) Patent No.: US 8,659,949 B1
(45) Date of Patent: Feb. 25, 2014

(54) THREE-DIMENSIONAL MEMORY STRUCTURE AND METHOD OF OPERATING THE SAME HYDRIDE

(71) Applicant: Macronix International Co., Ltd., Hsinchu (TW)

(72) Inventor: Shih-Hung Chen, HsinChu County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/729,092

(22) Filed: Dec. 28, 2012

(51) Int. Cl.
*G11C 11/34* (2006.01)

(52) U.S. Cl.
USPC ................. 365/185.18; 365/185.28; 365/174

(58) Field of Classification Search
USPC ................................ 365/185.18, 185.28, 174
See application file for complete search history.

(56) References Cited

U.S. PATENT DOCUMENTS 8,503,228 B2 * 8/2013 Juengling .................... 365/174

FOREIGN PATENT DOCUMENTS

TW     201232554      8/2012

OTHER PUBLICATIONS

English abstract translation of TW201232554 (Published Aug. 1, 2012).

Maeda, et al.: "Multi-stacked 1G cell/layer Pipe-shaped BiCS Flash Memory"; Center for Semiconductor Research & Development, Toshiba Corporation, Semiconductor Company 2-5-1 Kasama, Sakae-ku, Yokohama, Kanagawa, 247-8585, Japan Phone:+81-45-890-2420, Fax:+81-45-890-2893, E-mail:takashi11.maeda@toshiba.co.jp; 2009 Symposium on VLSI Circuits Digest of Technical Papers.

Ishiduki, et al.: "Optimal Device Structure for Pipe-shaped BiCS Flash Memory for Ultra High Density Storage Device with Excellent Performance and Reliability"; Center for Semiconductor Research & Development, Semiconductor Company, Toshiba Corporation; 97-4244-5640-6/09/$26.00 © 2009 IEEE.

* cited by examiner

*Primary Examiner* — Jason Lappas
(74) *Attorney, Agent, or Firm* — McClure, Qualey & Rodack, LLP

(57) ABSTRACT

A three-dimensional memory structure is provided, comprising plural stacked structures vertically formed on a substrate, each stacked structure comprising a bottom gate, wherein the bottom gates of the stacked structures are electrically connected; plural gates and gate insulators alternately stacked on the bottom gate; and two selection lines formed above the gates and spaced apart form each other and the selection lines being independently controlled, wherein the gate insulator fills between the selection lines, between the gate and the selection lines and forms on top of the selection lines for insulation. The 3D memory structure further comprises plural charge trapping multilayers formed outsides of the stacked structures and extending to the bottom gates; plural ultra-thin channels formed outsides of the charge trapping multilayers and lined between the adjacent stacked structures; and a dielectric layer formed between the ultra-thin channels and between the stacked structures.

20 Claims, 19 Drawing Sheets

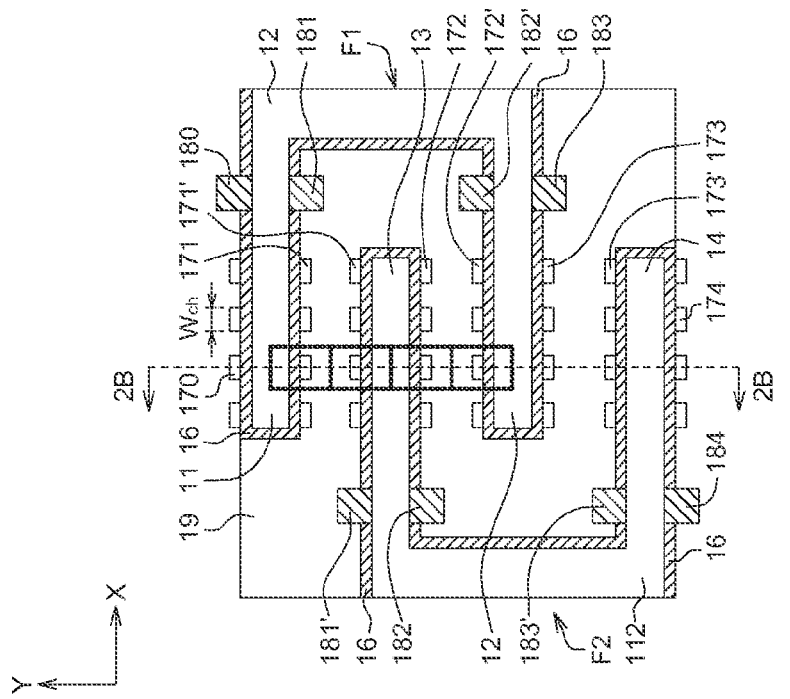
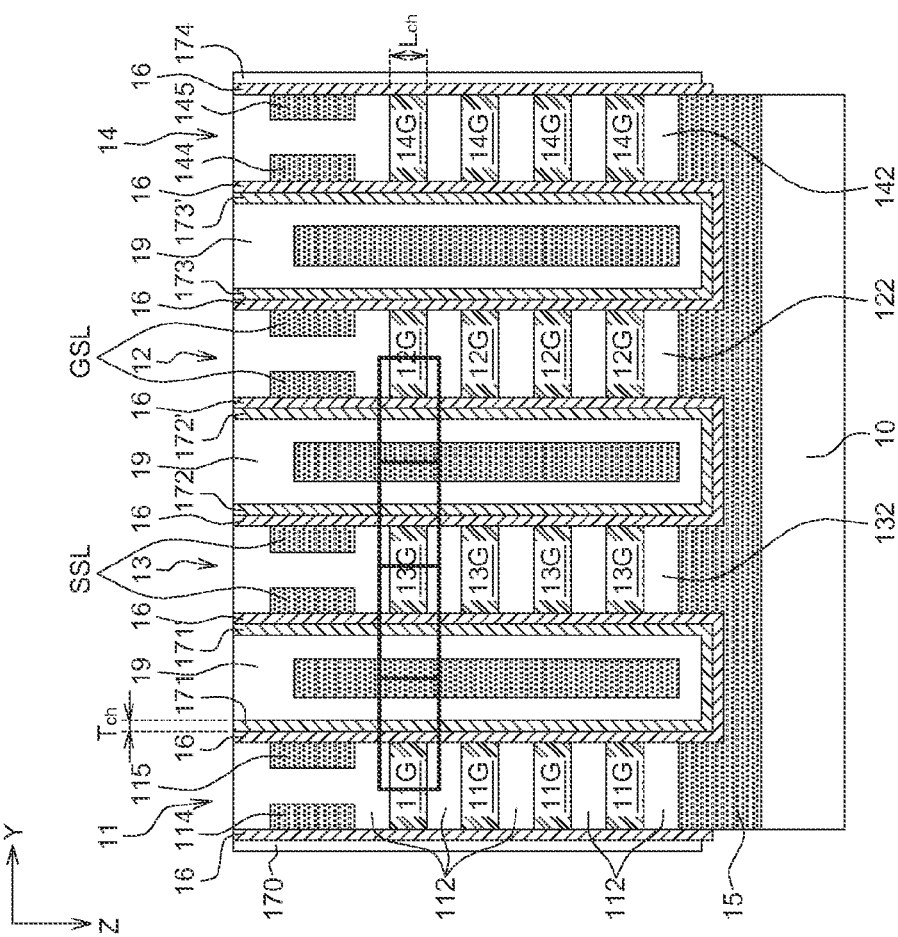
FIG. 2A
FIG. 2B

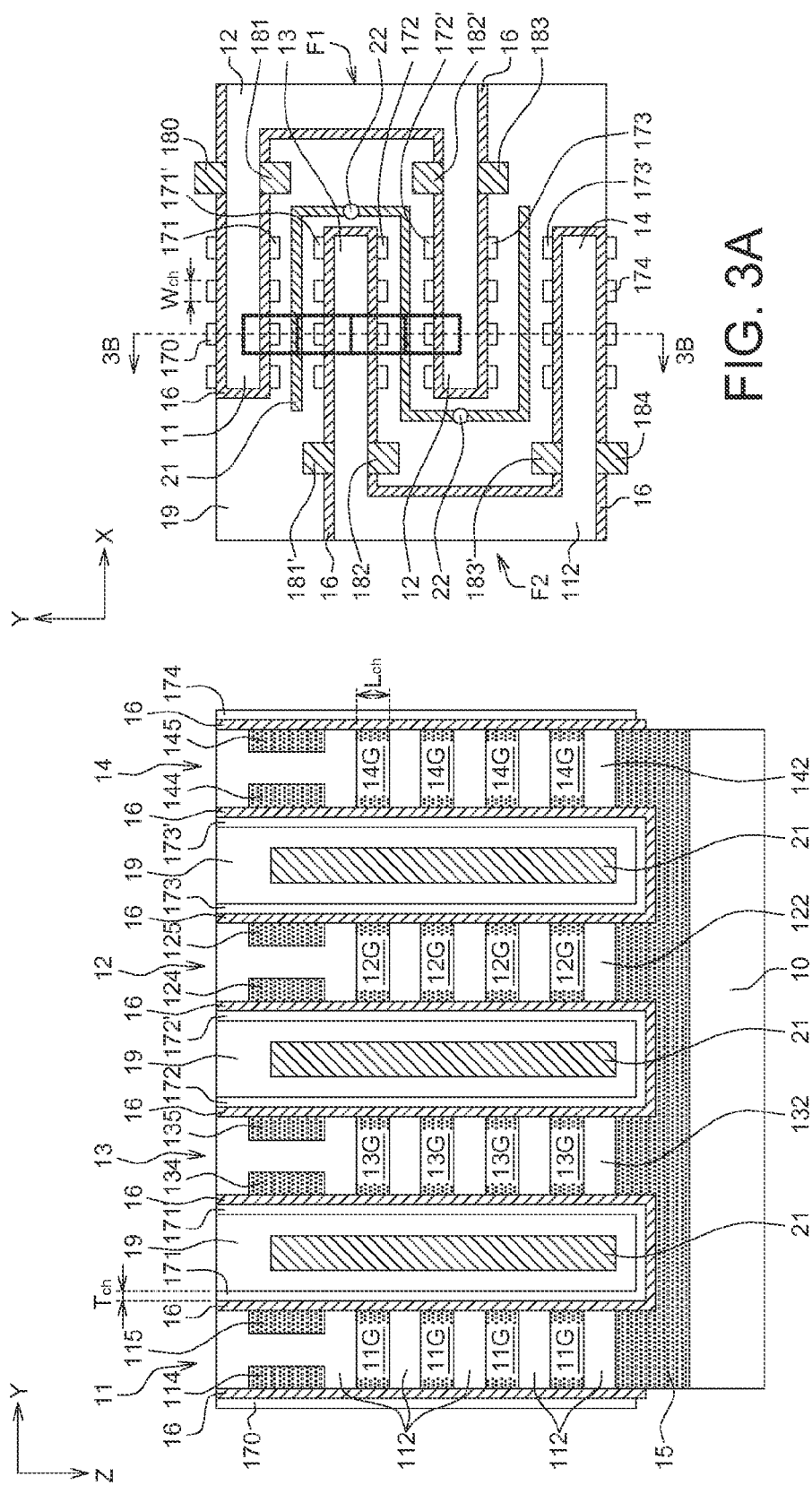

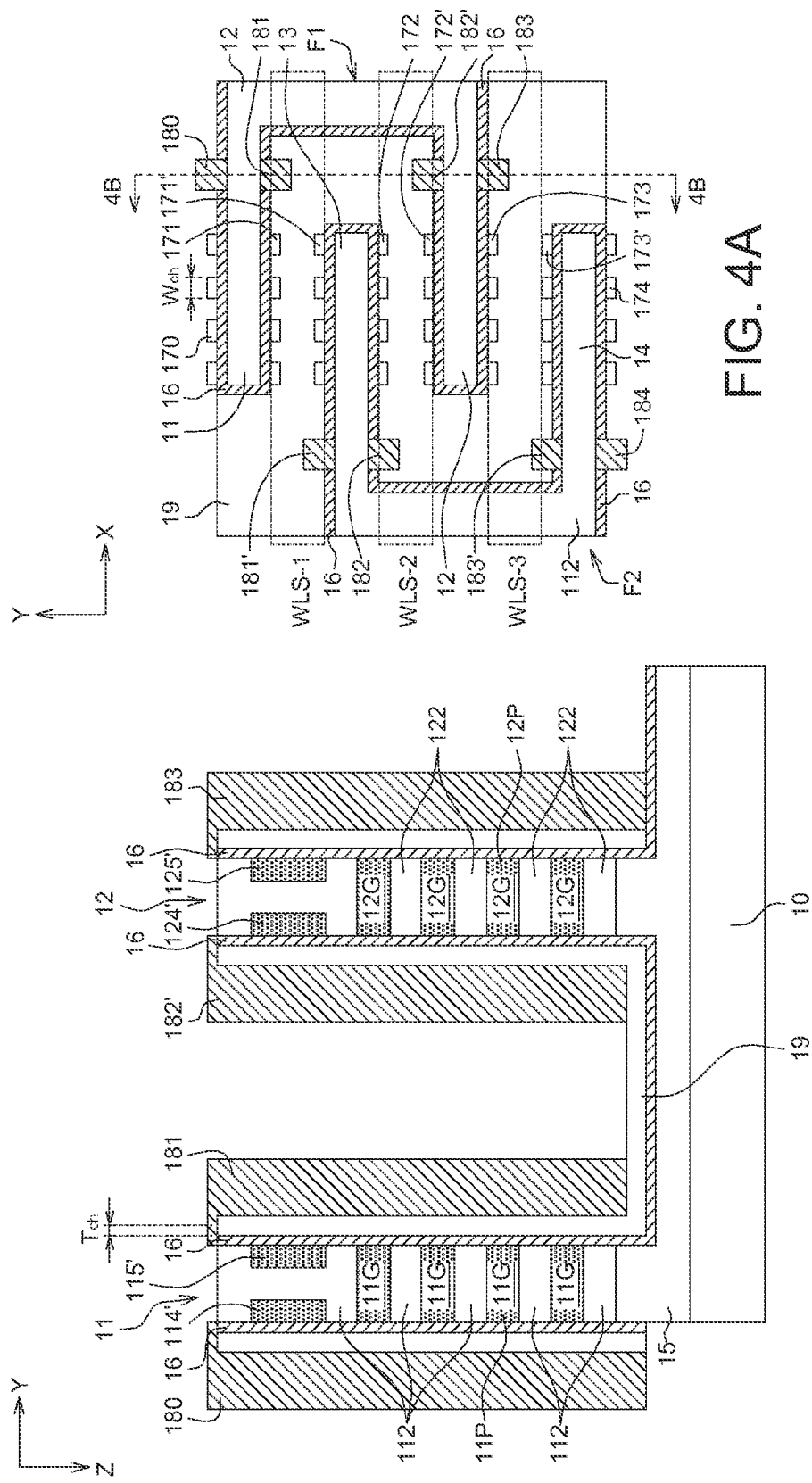

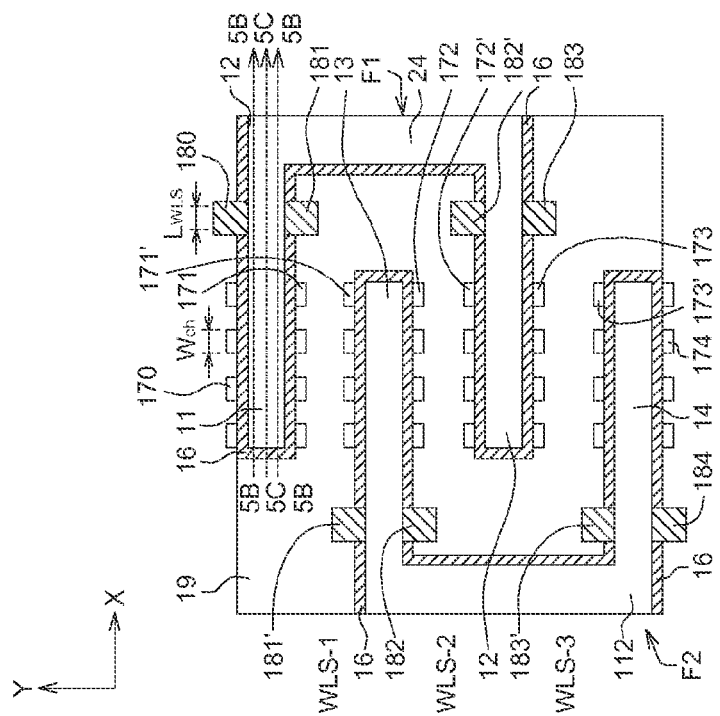
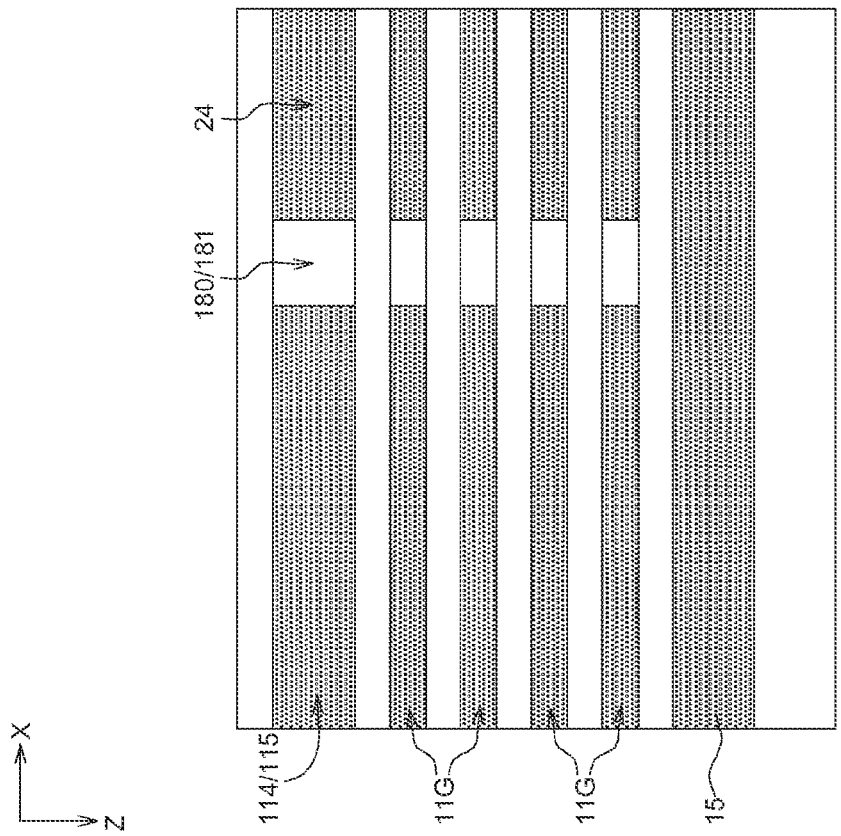
FIG. 5A
FIG. 5B

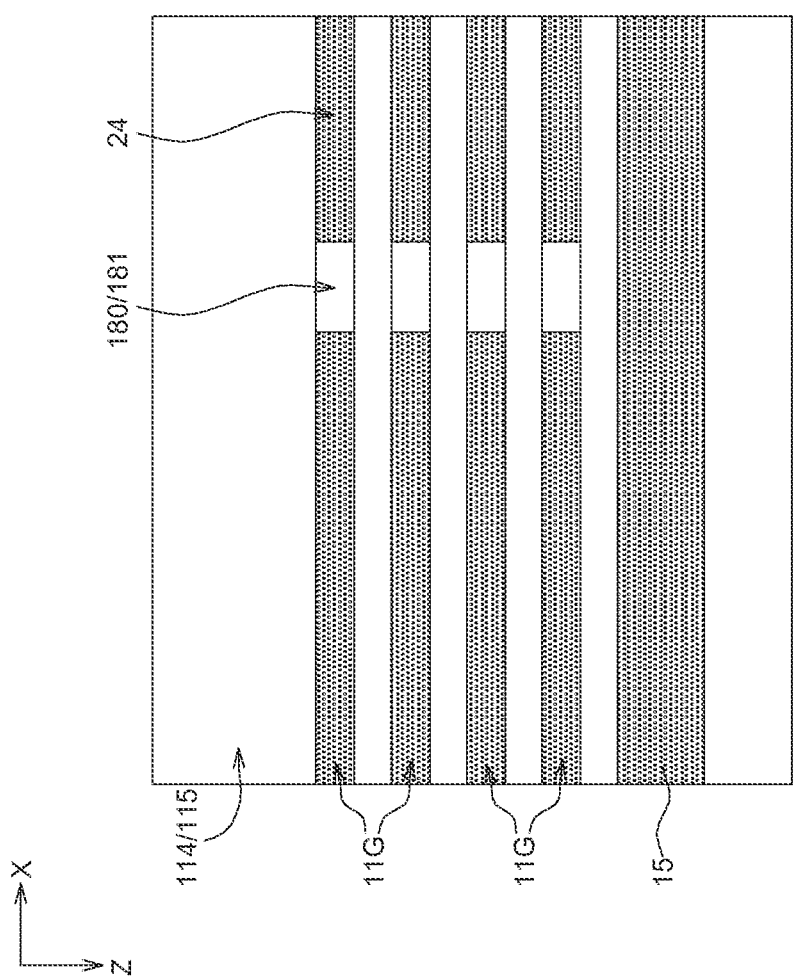

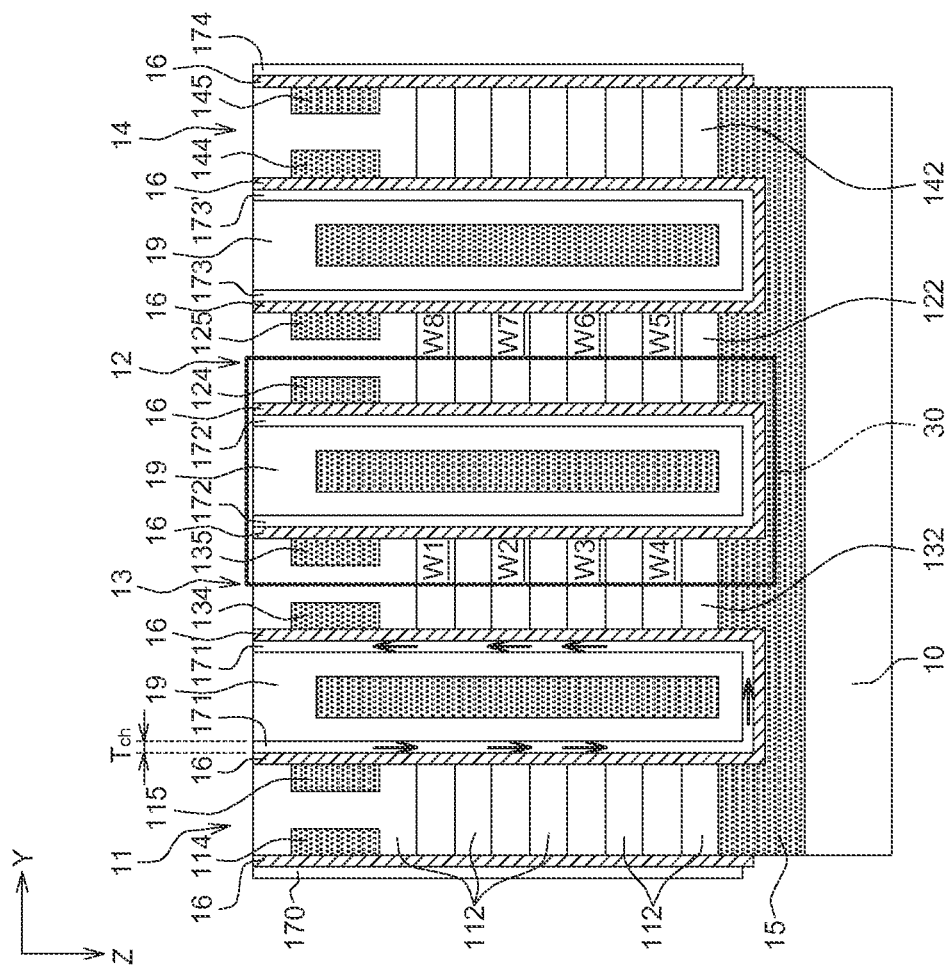

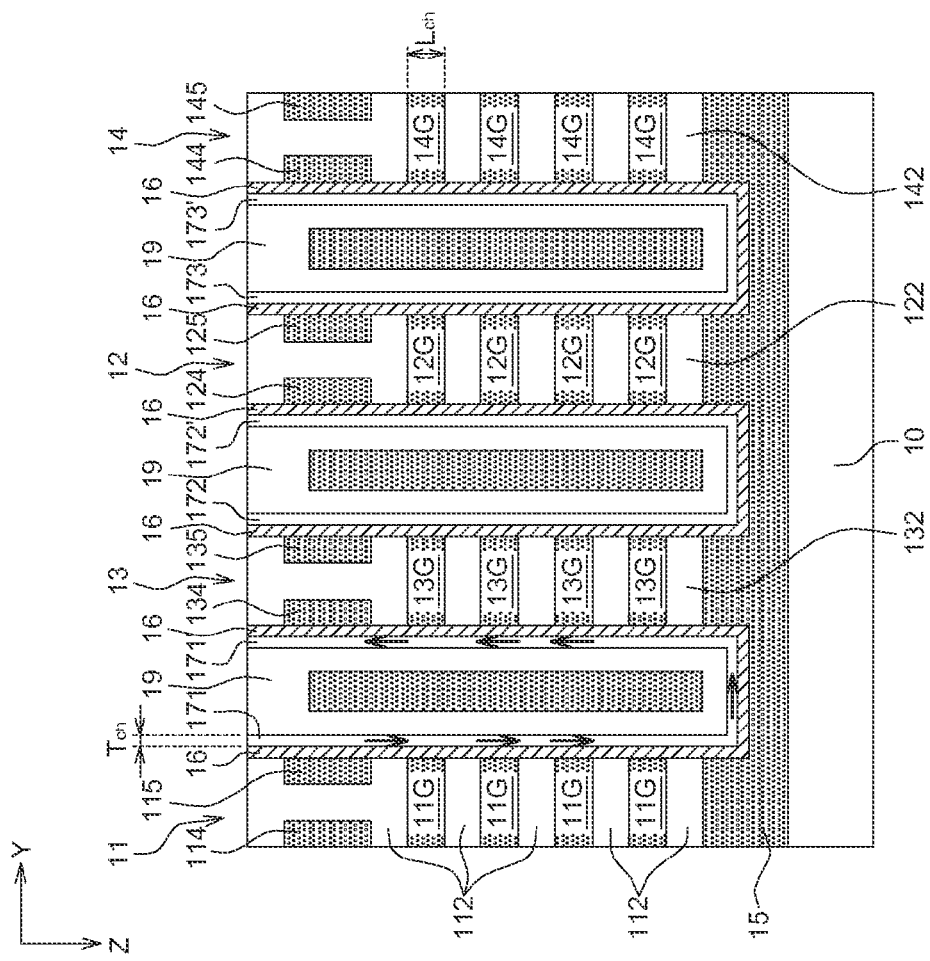
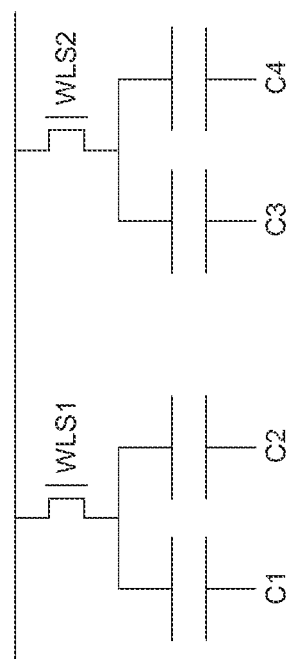
FIG. 10A
FIG. 10B

THREE-DIMENSIONAL MEMORY STRUCTURE AND METHOD OF OPERATING THE SAME HYDRIDE

BACKGROUND

1. Field of the Invention

The disclosure relates in general to a three-dimensional (3D) memory structure and method of operating the same, and more particularly to a single-gate 3D memory structure and method of operating the same.

2. Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed.

Recently, various 3D stacked structures, with single-gate unit cells, double gate unit cells and surrounding gate unit cells, have been provided. However, the more spaces occupied by the charge trapping multilayer (such as ONO multilayer), the more design rules to be considered in the size reduction of 3D stacked structure, which raises the difficulties of reducing size of unit cell. Compared to the 3D stacked structures with single-gate unit cells (each unit cell having one side ONO layer), the 3D stacked structures with double gate unit cells and surrounding gate unit cells would limit the potential and ability for size reduction. Moreover, if the thickness of the charge trapping multilayer is too thin, it would induce the issue of charge retention. Therefore, the thickness of the charge trapping multilayer has to be sufficient for charge retention when size of cell unit is reduced. To reduce the size of the 3D stacked structures, the charge trapping multilayer is not the only factor to be consider, considerations of design rules for other elements and effects on the electrical performance have to be included. The 3D stacked structures with double gate unit cells and surrounding gate unit cells are more complicated than that with single gate unit cells, which increase the difficulty of design and cost of manufacturing process.

Thus, it is desirable to develop a 3D memory structure not only with larger number of multiple planes being stacked to achieve greater storage capacity, but also with smaller unit cells and excellent electrical properties (such as reliability and stability of data storage), so that the smaller memory elements still can be erased and programmed. It is also desirable to fabricate this 3D memory structure with low manufacturing cost and not complicated manufacturing process.

SUMMARY

The disclosure relates to a 3D memory structure, and a method of operating the same is also provided. The 3D memory structure of the embodiment is related to the structures with single gate unit cells, which possesses much better potential and ability for size reduction. Also, the disturbance between the word lines of the 3D memory structure of the embodiment is greatly relieved.

According to one embodiment of the present disclosure, a three-dimensional (3D) memory structure is provided, comprising a plurality of stacked structures vertically formed on a substrate, each stacked structure comprising a bottom gate, wherein the bottom gates of the stacked structures are electrically connected to each other; a plurality of gates and a plurality of gate insulators alternately stacked on the bottom gate; and two selection lines formed above the gates and spaced apart form each other, and the selection lines being independently controlled, wherein the gate insulator fills between the selection lines, between the gate and the selection lines and forms on top of the selection lines for insulation. The 3D memory structure further comprises a plurality of charge trapping multilayers formed outsides of the stacked structures and extending to the bottom gates; a plurality of ultra-thin channels formed outsides of the charge trapping multilayers and lined between the adjacent stacked structures; and a dielectric layer formed between the ultra-thin channels and between the stacked structures.

According to another embodiment of the present disclosure, another 3D memory structure is provided, comprising a first finger-shaped stacked section and a second finger-shaped stacked section vertically formed on a substrate and staggered oppositely, the first finger-shaped stacked section comprising a first stacked structure and a second stacked structure extending along −x direction in a xy-plane, the second finger-shaped stacked section comprising a third stacked structure and a fourth stacked structure extending along +x direction in the xy-plane, the third stacked structure extending between the first and the second stacked structures, and each of the first to fourth stacked structures comprising a bottom gate, a plurality of gates and gate insulators alternately stacked on the bottom gate, and two selection lines independently formed above the gates along z direction, wherein the bottom gates of the first to fourth stacked structures are electrically connected to each other. The 3D memory structure further comprises a first charge trapping multilayer and a second charge trapping multilayer respectively formed outsides of the first and the second finger-shaped stacked sections, and extending to the bottom gates between adjacent stacked structures of the first to fourth stacked structures along z direction; a plurality of ultra-thin channels set apart at outsides of the first and the second finger-shaped stacked sections and extending downwardly, and two of the ultra-thin channels between the opposite sides of adjacent stacked structures of the first to fourth stacked structures correspondingly forming an ultra-thin U-shaped channel; a plurality of word line selectors, respectively disposed at two sides of one end of each stacked structure and electrically connected to the first and the second charge trapping multilayers; and a dielectric layer, filling between the ultra-thin channels, outside the word line selectors and between the first and the second finger-shaped stacked sections. The 3D memory structure has a plurality of unit cells, and each unit cell has one gate and one portion of the first or second charge trapping multilayers.

According to one application applied by the embodiment of the present disclosure, a chip having a plurality of the 3D memory structures as recited above is provided. The 3D memory structures of the chip are at least arranged as one row, and the 3D memory structures are controlled independently.

According to one embodiment of the present disclosure, a method for operating 3D memory structure is provided. First, a 3D memory structure is provided, comprising a plurality of stacked structures vertically formed on a substrate, and each stacked structure having a bottom gate, a plurality of word lines and a plurality of gate insulators alternately stacked on the bottom gate, and two selection lines independently formed above the word lines and spaced apart form each other, wherein one of the adjacent stacked structures has a string selection line (SSL) and the other has a ground selection line (GSL); a plurality of charge trapping multilayers formed outsides of the stacked structures and extending to the bottom gates; a plurality of ultra-thin U-shaped channels formed outsides of the charge trapping multilayers and lined between the adjacent stacked structures, and a word line selector (WLS) region defined between two adjacent stacked structures and comprising several of the ultra-thin U-shaped channels and a pair of word line selectors, wherein the pair of word line selectors are disposed in front and rear of the ultra-thin U-shaped channels for controlling the corresponding ultra-thin U-shaped channels; and a plurality of bit lines disposed above the selection lines and perpendicular to the word lines. A selected WLS region to-be-programmed is turned off, and all of non-selected WLS regions are turned on, wherein the ultra-thin U-shaped channels of the WLS region are turned on or turned off by turning on or off the pair of word line selectors. Then, the SSLs of the non-selected WLS regions are turned on and the GSLs of the non-selected WLS regions are turned off, and all of bit lines of the non-selected WLS regions are charged to an initial voltage, and then the SSLs of the non-selected WLS regions are turned off. Then, the non-selected WLS regions are turned off and turning on the selected WLS region is turned on, through the corresponding pairs of word line selectors. All of bit lines of the selected WLS region are charged to the initial voltage. Then, charges in one or more of the selected bit lines of the selected WLS region are released, and a high voltage is applied to a selected word line and a passing voltage (Vpass) is applied to non-selected word lines, so that channels of the non-selected bit lines are self-boosted to higher voltage. one or more selected bits are programmed subsequently.

The disclosure will become apparent from the following detailed description of the preferred but non-limiting embodiments. The following description is made with reference to the accompanying drawings.

BRIEF DESCRIPTION OF THE DRAWINGS

FIG. 2A illustrates the 3D memory structure of FIG. 1A showing the ranges of unit cells.

FIG. 2B is a cross-sectional view of the 3D memory structure along the cross-sectional line 2B-2B of FIG. 2A.

FIG. 3A illustrates the 3D memory structure of FIG. 1A with a shielding layer.

FIG. 3B is a cross-sectional view of the 3D memory structure along the cross-sectional line 3B-3B of FIG. 3A.

FIG. 4A illustrates the 3D memory structure of FIG. 1A with the word line selectors and related cross-sectional line.

FIG. 4B is a cross-sectional view of the 3D memory structure along the cross-sectional line 4B-4B of FIG. 4A.

FIG. 5A illustrates the 3D memory structure of FIG. 4A with related cross-sectional lines corresponding to the word line selector.

FIG. 5B and FIG. 5C are cross-sectional views of the 3D memory structure along the cross-sectional lines 5B-5B and 5C-5C of FIG. 5A, respectively.

FIG. 6C is a cross-sectional view of the 3D memory structure along the cross-sectional line 6C-6C of FIG. 6A.

FIG. 10A is a cross-sectional view of the 3D memory structure of the embodiment, wherein the elements are identical to that in FIG. 1A and details are not redundantly repeated.

FIG. 10B simply illustrates the capacitance of FIG. 10A.

DETAILED DESCRIPTION

In the embodiment of the present disclosure, a 3D memory structure with cell units each having single gate and one side charge trapping multilayer is provided. Also, a related operation method such as programming the 3D memory structure of the embodiment is also described herein. However, the methods for operating the 3D memory structure of the embodiment are not limited to the describing steps, and other operation steps could be carried out. Compared to the 3D memory structure with double-gate cells or surrounding-gate cells, the 3D memory structure with single-gate cells achieves greater storage capacity, smaller unit cells and excellent electrical properties (such as reliability and stability of data storage). Also, the disturbance between the word lines of the 3D memory structure of the embodiment is greatly relieved.

The embodiments disclosed below are for elaborating the 3D memory structure of the disclosure and a method for operating the same. However, the descriptions disclosed in the embodiments of the disclosure such as detailed construction, operating steps and material selections are for illustration only, not for limiting the scope of protection of the disclosure.

<3D Memory Structure>

Figure 1A:
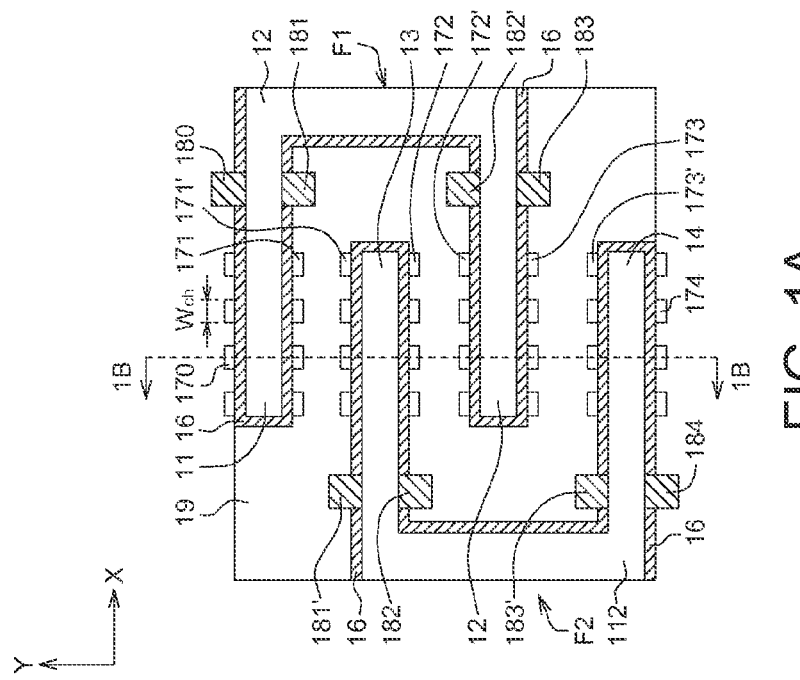
FIG. 1A is a top view of a 3D memory structure according to the embodiment of the present disclosure.
Figure 1B:
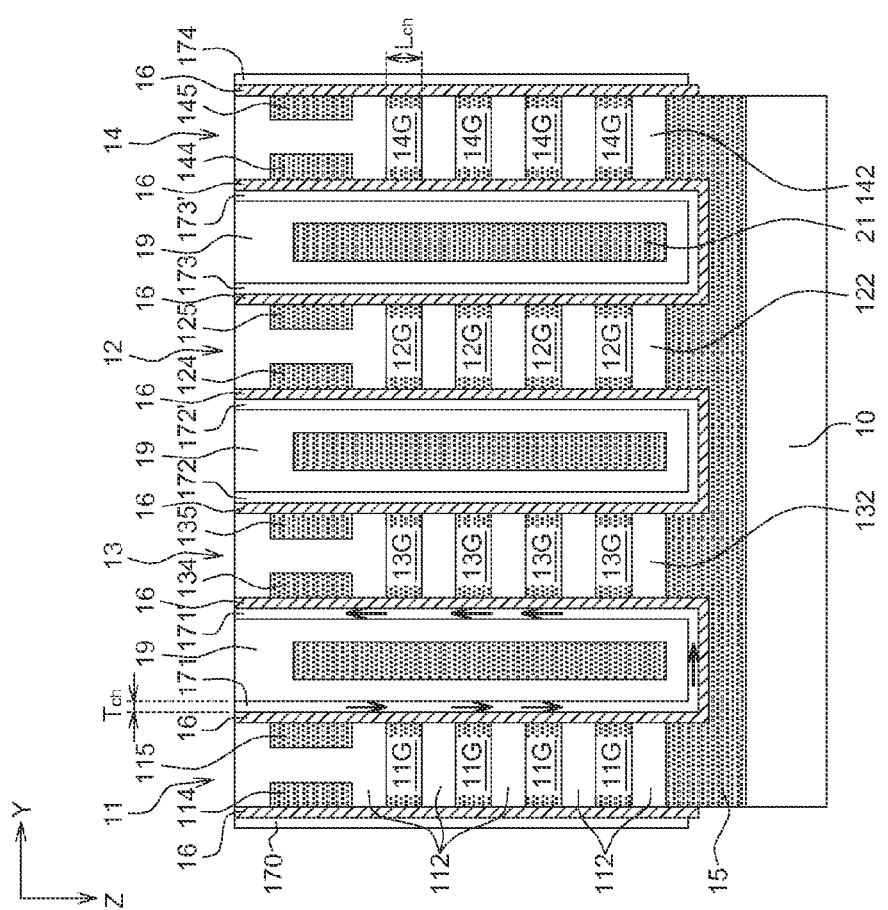
FIG. 1B is a cross-sectional view of the 3D memory structure along the cross-sectional line 1B-1B of FIG. 1A.

Please refer to FIG. 1A and FIG. 1B. FIG. 1A is a top view of a 3D memory structure according to the embodiment of the present disclosure. FIG. 1B is a cross-sectional view of the 3D memory structure along the cross-sectional line 1B-1B of FIG. 1A. Also, FIG. 1A and FIG. 1B show the 3D memory structure in a xy-plane and a zy-plane, respectively.

In the embodiment, the 3D memory structure comprises a plurality of stacked structures (11-14) vertically (z-direction) formed on a substrate 10. The substrate 10 could be an insulation substrate with silicon oxide. As shown in FIG. 1A, the 3D memory structure may comprise (but not limited to) a first finger-shaped stacked section F1 and a second finger-shaped stacked section F2 vertically formed on the substrate and staggered oppositely. The first finger-shaped stacked section F1 at least includes a first stacked structure 11 and a second stacked structure 12 extending along −x direction in the xy-plane. The second finger-shaped stacked section F2 at least includes a third stacked structure 13 and a fourth stacked structure 14 extending along +x direction in the xy-plane. The third stacked structure 13 extends between the first stacked structure 11 and the second stacked structure 12, while the second stacked structure 12 extends between the third stacked structure 13 and the fourth stacked structure 14.

As shown in FIG. 1B, from bottom to top and along the z direction, each of the first to fourth stacked structures 11-14 comprises a bottom gate 15, a plurality of gates 11G/12G/13G/14G and gate insulators 112/122/132/142 alternately stacked on the bottom gate 15, and two selection lines 114/124/134/144 and 115/125/135/145 independently formed above the gates 11G/12G/13G/14G. The bottom gates 15 of the first to fourth stacked structures 11-14 are electrically connected to each other, to form an U-shaped bottom gate (UBG) for being a pass gate. The gates 11G/12G/13G/14G function as word lines of the 3D memory structure. Take the first stacked structure 11 for example, the selection lines 114 and 115 above the gate 11G are spaced apart form each other and independently controlled. Also, an insulating layer (ex: made of material same as the gate insulator 112, such as SiO2) fills between the selection lines 114 and 115 and between the gate 11G and the selection lines, and forms on top of the selection lines 114 and 115 for insulation. In the embodiment, the gates and the selection lines are made of conductive material such as heavily doped polysilicon. In the embodiment, the layer of selection lines is thicker than the layer of each gate, but the disclosure is not limited thereto.

The 3D memory structure of the embodiment further comprises a plurality of charge trapping multilayers 16 formed outsides of the first to fourth stacked structures 11-14 and extending to the bottom gates 15. As shown in FIG. 1A, the charge trapping multilayers 16 are formed outsides of the first finger-shaped stacked section F1 and the second finger-shaped stacked section F2, and extending to the bottom gates 15 between adjacent stacked structures of the first to fourth stacked structures 11-14 along z direction as shown in FIG. 1B. The charge trapping multilayers 16 between two adjacent stacked structures present a U-shaped cross-section (FIG. 1B). The charge trapping multilayers 16 could be known as the ONO, ONONO or BE-SONOS multilayers, which are not limited herein.

The 3D memory structure of the embodiment further comprises a plurality of ultra-thin channels 170, 171, 171', 172, 172', 173, 173' and 174 formed at outsides of the charge trapping multilayers 16 and lined between the adjacent stacked structures. As shown in FIG. 1A, those ultra-thin channels at each stacked structure, such as the ultra-thin channels (170 or 171 or 171' or ... 174) along x direction and corresponding to the same y-position, are set apart by a distance. As shown in FIG. 1B, the ultra-thin channels are formed at outsides of the charge trapping multilayers 16 and extending downwardly, wherein two of the ultra-thin channels between the opposite sides of adjacent stacked structures of the first to fourth stacked structures 11-14 correspondingly constitute an ultra-thin U-shaped channel. For example, the ultra-thin channels 171 and 171' between the first stacked structure 11 and the third stacked structure 13 constitute an ultra-thin U-shaped channel; the ultra-thin channels 172 and 172' between the third stacked structure 13 and the second stacked structure 12 constitute an ultra-thin U-shaped channel; the ultra-thin channels 173 and 173' between the second stacked structure 12 and the fourth stacked structure 14 constitute an ultra-thin U-shaped channel. In the embodiment, the current path in the ultra-thin U-shaped channel is denoted by the arrows in FIG. 1B.

In the embodiment, the two selection lines of each stacked structure are two string selection lines (SSLs) or two ground selection lines (GSLs), and the charge trapping multilayers 16 between the adjacent stacked structures are electrically connected to one string selection line SSL and one ground selection line GSL. For example, the selection lines 114 and 115 of the first stacked structure 11 and the selection lines 124 and 125 of the second stacked structure 12 in FIG. 1B are GSLs, while the selection lines 134 and 135 of the third stacked structure 13 and the selection lines 144 and 145 of the fourth stacked structure 14 in FIG. 1B are SSLs. For the adjacent first stacked structure 11 and third stacked structure 13, the charge trapping multilayers 16 beside the ultra-thin channels 171 and 171' are electrically connected to one GSL (115) and one SSL (134). Similarly, for the adjacent third stacked structure 13 and the second stacked structure 12, the charge trapping multilayers 16 beside the ultra-thin channels 172 and 172' are electrically connected to one SSL (135) and one GSL (124). For the adjacent second stacked structure 12 and the fourth stacked structure 14, the charge trapping multilayers 16 beside the ultra-thin channels 173 and 173' are electrically connected to one GSL (125) and one SSL (144). The adjacent SSL and GSL function as a switch of the corresponding ultra-thin U-shaped channel. For example, the ultra-thin U-shaped channel (171+171') between the first stacked structure 11 and the third stacked structure 13 can be selectively turned on by the adjacent SSL 115 and SSL 134. The ultra-thin U-shaped channel (172+172') between the third stacked structure 13 and the second stacked structure 12 can be selectively turned on by the adjacent SSL 135 and SSL 124. The ultra-thin U-shaped channel (173+173') between the second stacked structure 12 and the fourth stacked structure 14 can be selectively turned on by the adjacent GSL 155 and SSL 144.

In the embodiment, a thickness of each gate 11G/12G/13G/14G is defined as a channel length (Lch) as denoted in FIG. 1B. A channel width (Wch) is denoted in FIG. 1A. In one of the embodiments, a channel thickness (Tch, denoted in FIG. 1B) of each ultra-thin channel 170/171/171'/172/172'/173/173'/174 is about ¼ of the channel length (Lch). In one of the embodiments, the channel thickness Tch is in a range of 1/10 of Lch to ½ of Lch, and could be denoted as 1/10 of Lch<Tch<½ of Tch, while the channel length Lch is in the range of 50 Å to 300 Å, and could be denoted as 50 Å<Lch<300 Å. In one of the embodiments, a channel thickness of each ultra-thin channel is, not limited to, about 20 Å~100 Å.

Please refer to FIG. 2A and FIG. 2B. FIG. 2A illustrates the 3D memory structure of FIG. 1A showing the ranges of unit cells. FIG. 2B is a cross-sectional view of the 3D memory structure along the cross-sectional line 2B-2B of FIG. 2A. In FIG. 2A and FIG. 2B, each unit cell is denoted by a rectangular dashed line. The identical elements of FIG. 1A, FIG. 1B and FIG. 2A, FIG. 2B are designated with the same reference numerals where appropriate, and the details are not redundantly repeated. In the embodiment, the charge trapping multilayer 16 between the channel and the word line (gate) is the memory element of unit cell. In the y-direction (i.e. extending direction of bit lines), each unit cell includes single gate and one portion of the charge trapping multilayer. As shown in FIG. 1B and FIG. 2B, two adjacent unit cells share one of the gates 11G/12G/13G/14G. Compared to the 3D stacked structures with double gate and surrounding gate unit cells, the 3D stacked structures with single gate unit cells of the embodiment possesses much better potential and ability for size reduction. Also, according to the design of 3D stacked structure of the disclosure, it still has much room for the charge trapping multilayer 16 with sufficient thickness for charge retention in size reduction. Data storage stability relies on the good ability of charge retention of the memory layer. Therefore, the 3D stacked structure of the disclosure possesses size reduction ability and excellent electrical performance. Also, the design rules of the 3D stacked construction of the embodiment simplify the manufacturing process, so as to diminish the cost of production. Moreover, with the same process limitation, the memory density of the 3D stacked construction of the embodiment is double of that of the traditional finger vertical-gate (VG) 3D structure.

Moreover, the 3D memory structure of the embodiment further comprises a dielectric layer 19 formed between the ultra-thin channels and between the stacked structures, such as filling the spaces between the first to fourth stacked structures 11-14 and outside the ultra-thin channels 170, 171, 171', 172, 172', 173, 173' and 174, as shown in FIG. 1A and FIG. 2A.

In one embodiment, the 3D memory structure may optionally comprise a shielding layer formed in the dielectric layer 19, depending on the requirements of practical applications. Please refer to FIG. 3A and FIG. 3B. FIG. 3A illustrates the 3D memory structure of FIG. 1A with a shielding layer. FIG. 3B is a cross-sectional view of the 3D memory structure along the cross-sectional line 3B-3B of FIG. 3A. The identical elements of FIG. 1A, FIG. 1B and FIG. 3A, FIG. 3B are designated with the same reference numerals where appropriate, and the details are not redundantly repeated. As shown in FIG. 3A and FIG. 3B, a shielding layer 21 is further formed in the dielectric layer 19 by extending between the ultra-thin channels of the adjacent stacked structures, for reducing the disturbance between the charge trapping multilayers 16 of adjacent stacked structures. For example, the shielding layer could be an U-shaped channel shielding layer continuously running between the ultra-thin channels of the adjacent stacked structures (FIG. 3A). Furthermore, the shielding layer 21 might have a ground contact 22. In the embodiment, the shielding layer 21 is made of conductive material, such as conductive polysilicon. In practical application, the shielding layer 21 could be incorporated or omitted, depending on the electrical performance of the 3D memory structure. The overall size of the 3D memory structure, particular the dimension along the y-direction, could be further reduced without formation of the shielding layer 21.

Moreover, the 3D memory structure of the embodiment further comprise a plurality of word line selectors (WLS) 180, 181, 181', 182, 182', 183, 183' and 184, respectively disposed at two sides of one end of each stacked structure (11/12/13/14) and electrically connected to the charge trapping multilayers 16, as shown in FIG. 1A and FIG. 2A. Please refer to FIG. 4A and FIG. 4B. FIG. 4A illustrates the 3D memory structure of FIG. 1A with the word line selectors and related cross-sectional line. FIG. 4B is a cross-sectional view of the 3D memory structure along the cross-sectional line 4B-4B of FIG. 4A. The identical elements of FIG. 1A, FIG. 1B and FIG. 4A, FIG. 4B are designated with the same reference numerals where appropriate, and the details are not redundantly repeated. As shown in FIG. 4A and FIG. 4B, the word line selectors (WLS) 180, 181, 181', 182, 182', 183, 183' and 184 of the embodiment are a plurality of single side island WL selectors, and each of the single side island WL selectors is formed at one side of the end of each stacked structure and extends to a bottom of the stacked structure, and a top of the single side island WL selector is coupled to (but not limited to) the corresponding charge trapping multilayer 16.

Please refer to FIG. 4A, which the several ultra-thin U-shaped channels between the adjacent stacked structures are arranged as a matrix with m rows and n columns in the xy-plane. For example, the ultra-thin U-shaped channels are disposed as 3 rows and 4 columns, and each row is corresponding to each WLS region (WLS-1/WLS-2/WLS-3 of FIG. 4A). Each pair of the word line selectors are disposed in the front and rear of the ultra-thin U-shaped channels arranged in the same row. The word line selectors are selected by pairs during operation. In FIG. 4A, a pair of the word line selectors 181 and 181' are corresponding to the WLS-1 region, a pair of the word line selectors 182 and 182' are corresponding to the WLS-2 region, a pair of the word line selectors 183 and 183' are corresponding to the WLS-3 region. In operating the 3D memory structure of the embodiment, the word lines of the WLS region are selected by selecting the corresponding pair of the word line selectors. For example, if the word line selectors 182 and 182' are selected, the four ultra-thin U-shaped channels in the WLS-2 region are selected. The word line selectors 182 and 182' are selected and turned on in order to transmit the signal from the decoder to the ultra-thin U-shaped channels in the WLS-2 region. Compared to plural word lines of the traditional finger vertical-gate (VG) 3D structure shorted together, the word line selectors of the 3D stacked structure of the embodiment are introduced for sectional selections, thereby greatly reducing the disturbance between the word lines. The disturbance merely occurs at the gate/word line shared by two adjacent unit cells.

As shown in FIG. 4B, in order to turn off the word line selectors 180, 181, 182' and 183 at the ends of the first stacked structure 11 and the second stacked structure 12, the doping concentration of the polysilicon portions 11P and 12P between the insulators should be low, and non-doping channel here is preferred in one of the embodiment. Also, in one embodiment, the word line selectors could be made of thick oxide, and the thickness of oxide could be larger than 300 Å, and a channel length ($LW_{LS}$) of word line selector could be larger than 1 μm for HV (high voltage operation) requirement. In one embodiment, a dielectric portion is formed between the charge trapping multilayer 16 and the word line selectors 180, 181, 182' and 183, and could be made of the same material of the dielectric layer 19, such as $SiO_2$ or other dielectric materials. Also, the word line selector of one embodiment could be a transistor with single gate design, such as NMOS or PMOS, depending on the requirements of practical application. Those details of dimensions or constructions are not disclosed for limiting the scope of the disclosures.

Please refer to FIG. 5A-FIG. 5C. FIG. 5A illustrates the 3D memory structure of FIG. 4A with related cross-sectional lines corresponding to the word line selector. FIG. 5B and FIG. 5C are cross-sectional views of the 3D memory structure along the cross-sectional lines 5B-5B and 5C-5C of FIG. 5A, respectively. In FIG. 5A, two cross-sectional lines 5B-5B and 5C-5C are drawn at the first stacked structure 11 and close to the word line selectors 180 and 181, respectively. In FIG. 5B, the polysilicon portions of the word lines (i.e. gates 11G) and the selection lines 114/115 are highly doped, while the polysilicon portions of the word line selectors 180 and 181 are low-doped even non-doped. The polysilicon portions of the layer contact areas (described later) in the rear ends of stacked structures are also highly doped. The cross-sectional line 5C-5C of FIG. 5A is positioned between the word line selectors 180 and 181, and corresponds to the middle of the first stacked structure 11, and FIG. 5C consequently shows no polysilicon portions of the selection lines 114/115 (the selection lines 114 and 115 being spaced apart by a gap as shown in FIG. 1B). Other portions in FIG. 5C are identical to that in FIG. 5A, which are not repeated redundantly.

Figure 6A:
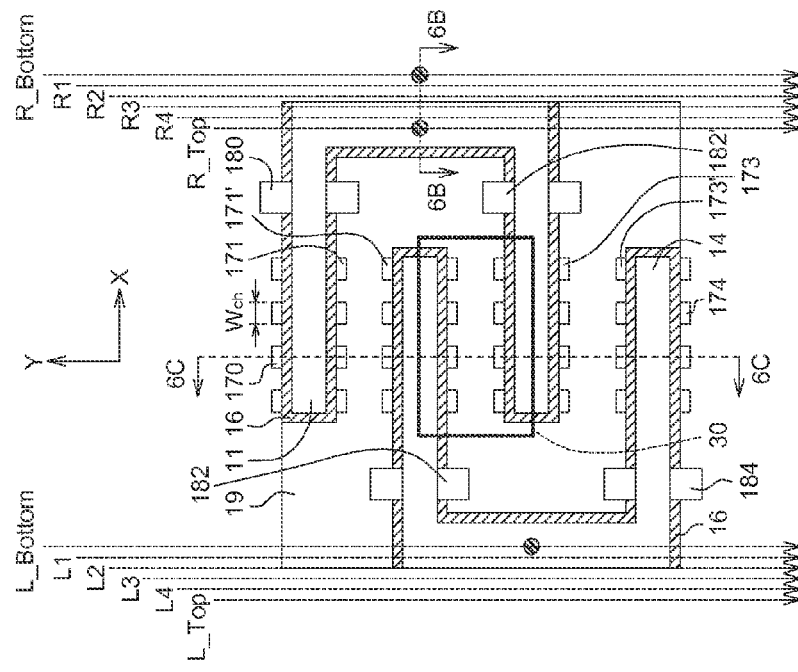
FIG. 6A illustrates the 3D memory structure of FIG. 1A with the layer contact lines and layer contacts.
Figure 6B:
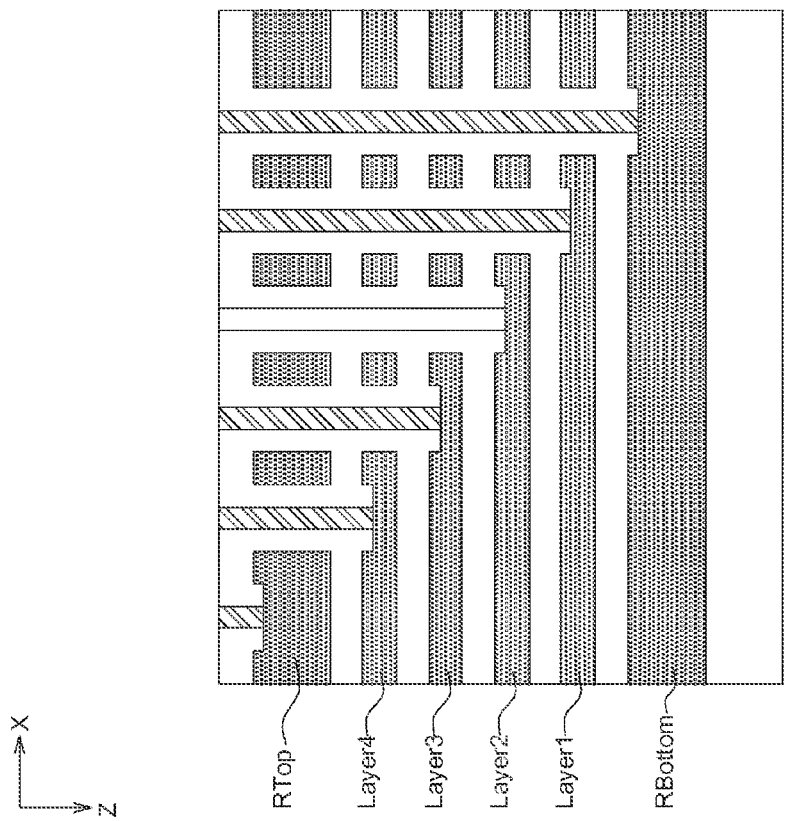
FIG. 6B is a cross-sectional view of the 3D memory structure along the cross-sectional line 6B-6B of FIG. 6A.

The 3D memory structure further comprises a plurality of layer contact lines formed at the sides of the first finger-shaped stacked section F1 and the second finger-shaped stacked section F2, and the layer contact lines have layer contacts electrically connected to the bottom gate, the gates and the selection lines correspondingly for transmitting signals. Please refer to FIG. 6A and FIG. 6B. FIG. 6A illustrates the 3D memory structure of FIG. 1A with the layer contact lines and layer contacts. FIG. 6B is a cross-sectional view of the 3D memory structure along the cross-sectional line 6B-6B of FIG. 6A. The identical elements of FIG. 1A, FIG. 1B and FIG. 6A, FIG. 6B are designated with the same reference numerals where appropriate, and the details are not redundantly repeated. If N of memory layers are formed in the 3D memory structure, 2N+4 of layer contacts are constructed for electrical connection (N is positive integer). Take four memory layers Layer1-Layer4 as illustrated in the embodiment for example. It means that eight (=2×4, 2N) layer contacts are formed at the layer contact lines L1, L2, L3, L4, R1, R2, R3, and R4, respectively. Also, four layer contacts are formed at the layer contact lines L_Top, R_Top, L_Bottom and R_Bottom, respectively. The layer contact at the layer contact lines L_Top is coupled to the SSL, and the layer contact at the layer contact lines R_Top is coupled to the GSL. The layer contacts at the layer contact lines L_Bottom and R_Bottom are coupled to the bottom gates (the bottom gates are shorted). Because of the construction of the word line selectors 180, 181, 181', 182, 182', 183, 183' and 184 in the embodiment, those layer contact lines could be disposed in the direction parallel to the bit lines and perpendicular to the word lines.

FIG. 6C is a cross-sectional view of the 3D memory structure along the cross-sectional line 6C-6C of FIG. 6A. Please refer to FIG. 6A and FIG. 6C. The elements of FIG. 6C are identical to FIG. 1B, and the details are not redundantly repeated. In the U-shaped block 30 of FIG. 6A and FIG. 6C, the word lines W1/W2/W3/W4/W5/W6/W7/W8 are formed at two sides of the ultra-thin U-shaped channel, and the SSL and the GSL are formed at the top while the bottom gate 15 (ex: UBG) is formed at the bottom. The signals for the word lines W1/W2/W3/W4 are respectively transmitted through the layer contact lines L1/L2/L3/L4, while the signals for the word lines W5/W6/W7/W8 are respectively transmitted through the layer contact lines R1/R2/R3/R4. The signals for the SSL and GSL are respectively transmitted through the layer contact lines L_Top and R_Top. The signal for the bottom gate 15 (ex: UBG) is transmitted through the layer contact line L_Bottom and/or R_Bottom. The word line selectors (WLS) control whether these signals enter the U-shaped block 30. For example, if the word line selectors 182 and 182' are turned on, the signals would be transmitted to the word lines and bottom gate in the U-shaped block 30. As depicted in the top view of FIG. 6A, the word line selectors (WLS) are disposed behind the layer contacts. Also, in the embodiment, the WLS are disposed inside the memory array, and several WLS share with one of layer contact line (FIG. 4A, FIG. 6A).

Figures 7A, 7B:
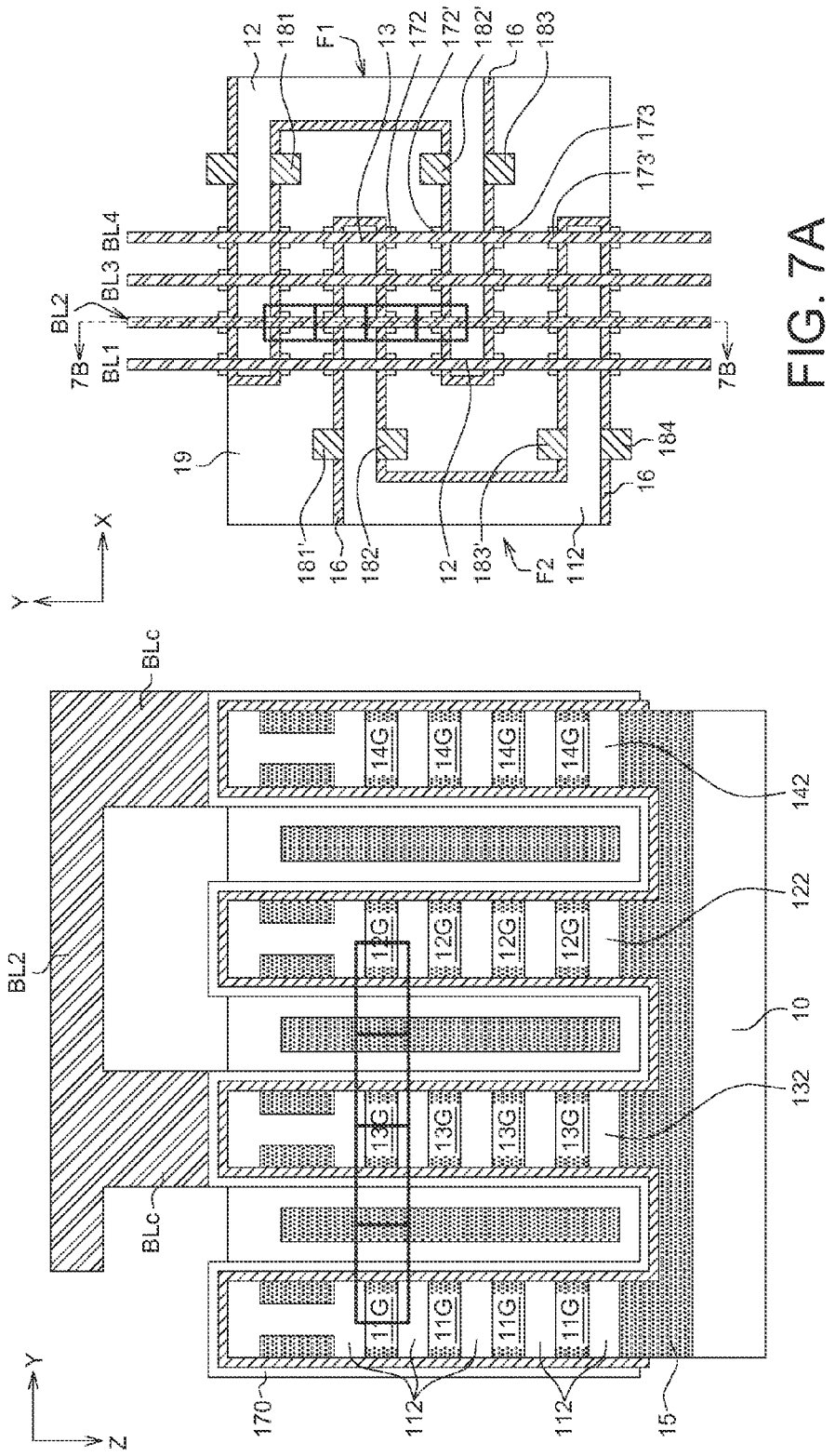
FIG. 7A illustrates the 3D memory structure of FIG. 1A with bit lines.
FIG. 7B is a cross-sectional view of the 3D memory structure along the bit line direction of FIG. 7A.

The 3D memory structure further comprises a plurality of bit lines BL1-BLn perpendicular to the word lines (i.e. perpendicular to an extending direction of the gates), and each bit line is coupled to the corresponding ultra-thin U-shaped channels arranged in the same column. Those bit lines BL1-BLn are coupled to the page buffer. Please refer to FIG. 7A and FIG. 7B. FIG. 7A illustrates the 3D memory structure of FIG. 1A with bit lines. FIG. 7B is a cross-sectional view of the 3D memory structure along the bit line direction of FIG. 7A. The identical elements of FIG. 1A-FIG. 1B, FIG. 2A-FIG. 2B and FIG. 7A-FIG. 7B are designated with the same reference numerals where appropriate, and the details are not redundantly repeated. Four bit lines BL1-BL4 perpendicular to the word lines are taken for illustration in FIG. 7A. Each bit line has a plurality of bit line contacts. In order to acquire higher memory density with less process challenge, every bit line contact could physically connect with two adjacent ultra-thin U-shaped channels. However, the connection way of the disclosure is not limited herein, and could be modified depending on the needs of practical applications.

Figure 8A:
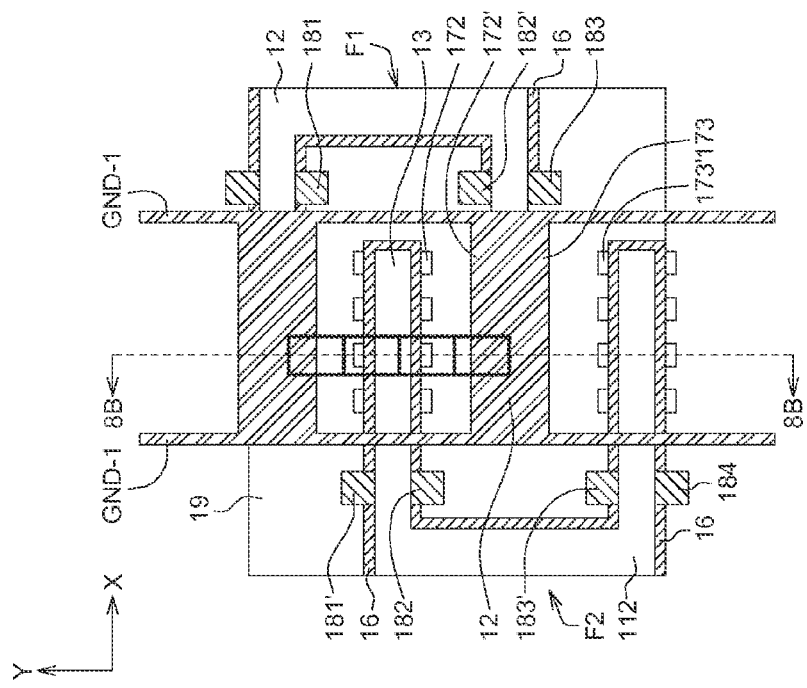
FIG. 8A illustrates the 3D memory structure of FIG. 1A with ground lines.
Figure 8B:
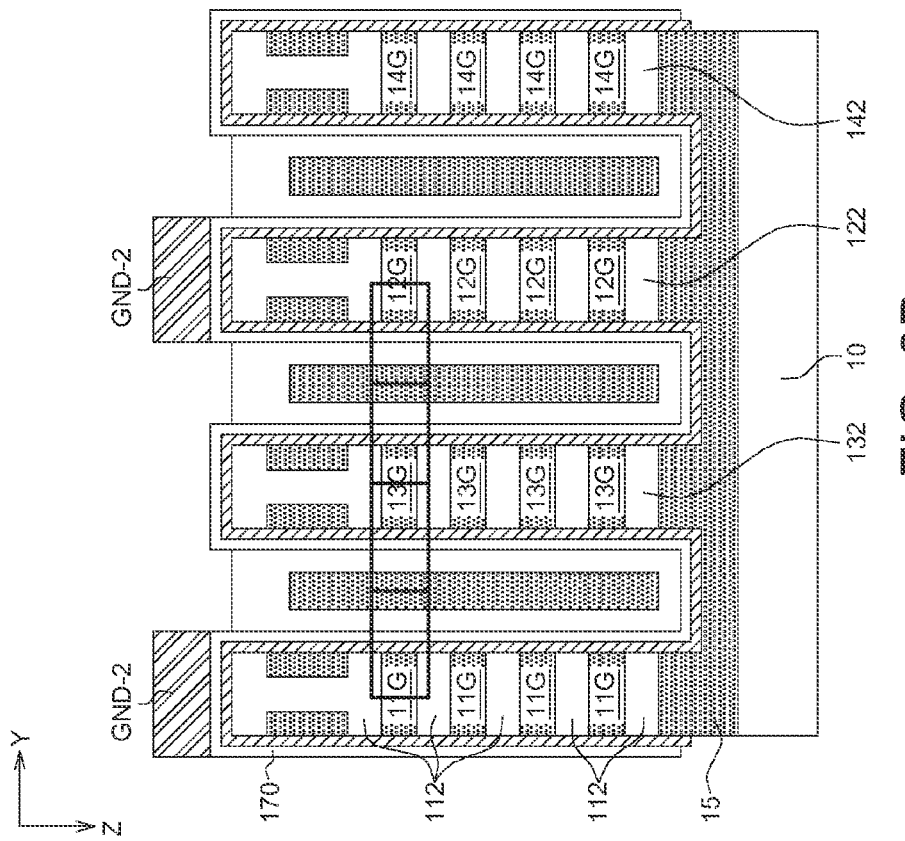
FIG. 8B is a cross-sectional view of the 3D memory structure along the bit line direction as depicted in FIG. 7A.
Figure 9A:
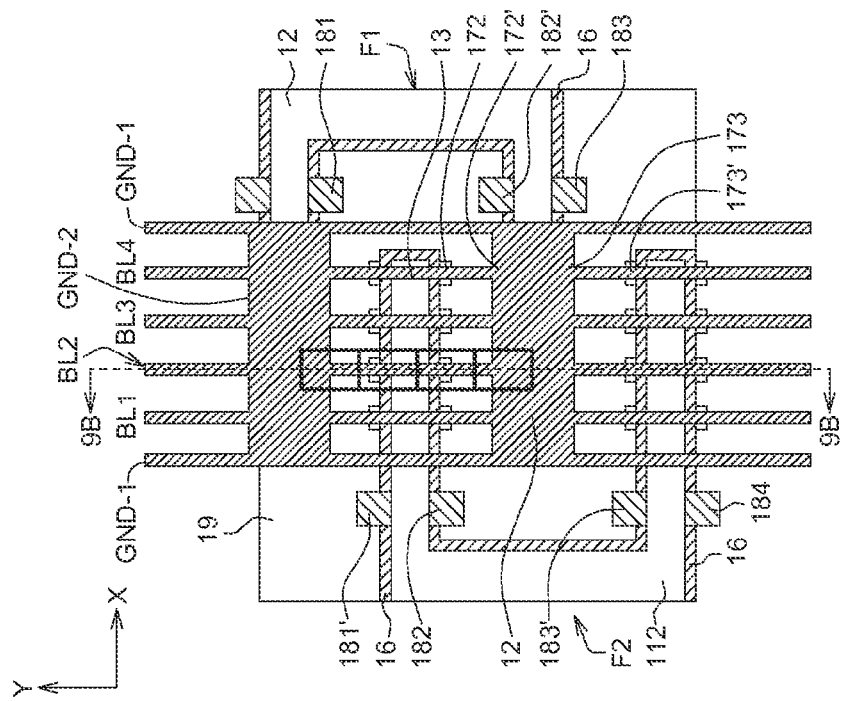
FIG. 9A is a top view of the 3D memory structure showing bit lines and ground lines.
Figure 9B:
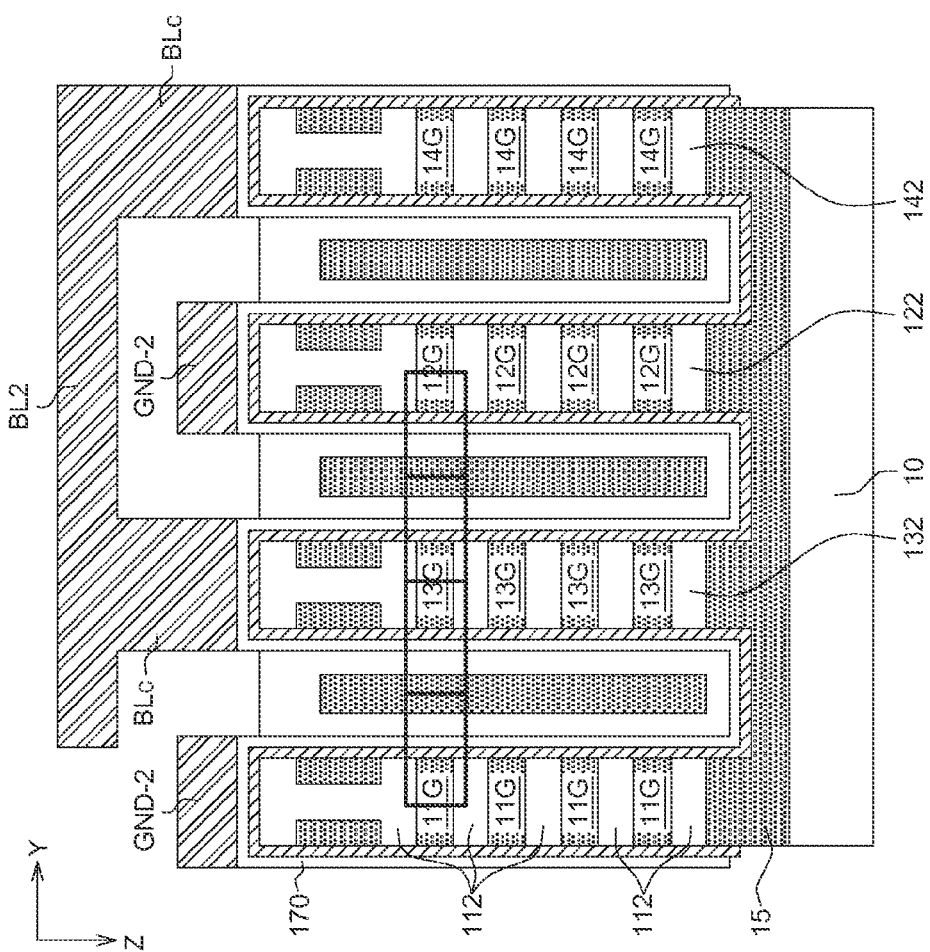
FIG. 9B is a cross-sectional view of the 3D memory structure showing bit lines and ground lines.

The 3D memory structure further comprises a plurality of ground lines coupled to the page buffer. Please refer to FIG. 8A and FIG. 8B. FIG. 8A illustrates the 3D memory structure of FIG. 1A with ground lines. FIG. 8B is a cross-sectional view of the 3D memory structure along the bit line direction as depicted in FIG. 7A. The identical elements of FIG. 1A-FIG. 1B, FIG. 7A-FIG. 7B and FIG. 8A-FIG. 8B are designated with the same reference numerals where appropriate, and the details are not redundantly repeated. In this embodiment, the ground lines include the first ground lines GND-1 and the second ground lines GND-2. The first ground lines GND-1 are parallel to the bit lines (perpendicular to an extending direction of the gates), and each first ground line GND-1 connects the ultra-thin channels arranged in the same column and different rows. The second ground lines GND-2 are perpendicular to the first ground lines GND-1, and electrically connects the first ground lines. Each second ground line GND-2 further connects the ultra-thin channels arranged in two sides of the same stacked structure. Similar to the bit line contacts, in order to acquire higher memory density with less process challenge, the width of the second ground line GND-2 would cover two adjacent ultra-thin U-shaped channels, as depicted in FIG. 8B. However, the connection way of the ground line contact is not limited herein, and could be modified depending on the needs of practical applications. FIG. 9A is a top view of the 3D memory structure showing bit lines and ground lines. FIG. 9B is a cross-sectional view of the 3D memory structure showing bit lines and ground lines.

Accordingly to the aforementioned description, the array and function designs of the disclosed and conventional 3D stacked structures are very different. Compared to the traditional finger vertical-gate (VG) 3D structure with multi-layer built for bit lines, split page design and double gated island SSL, the 3D stacked structures of the embodiment has multi-layer built for word lines, split WL design, single gated unit cell and the single side island WL selectors. With the design of single side island WL selectors, the WL selectors are selected and turned on if it is required to transmit signals to the word lines in the corresponding area, thereby greatly reducing the disturbance between the word lines. Also, with WL selectors, the common layer contact line could be introduced into the design for saving the space occupied by the layer contact area. For the traditional finger VG 3D structure, moreover, if a selected word line is operated, all the non-selected word lines are charged together because all of the word lines are shorted; therefore, the overall capacitance is the sum of all WL capacitances, C=C1+C2+ . . . Cn (C1 from WL1, C2 from WL2 . . . etc.). Additionally, RC delay is also very important for a 3D stacked structure. If RC is too high, not only speed but also signal disturbance would be the issues for the 3D stacked structure. The most simple and direct way to solving the problem of RC delay is to reduce resistance and capacitance. In the embodiment, the WL capacitance is virtually divided into several separated parts due to the construction of WL selectors. Only the selected word line is charged up for operation, while the non-selected word lines are not charged, thereby reducing the capacitances (ex: $C=C_1$ or $C_2$ or . . . $C_n$) for relieving the RC delay, saving the power, speeding up the signal transmitting, and decreasing disturbance between word lines.

Figure 11A:
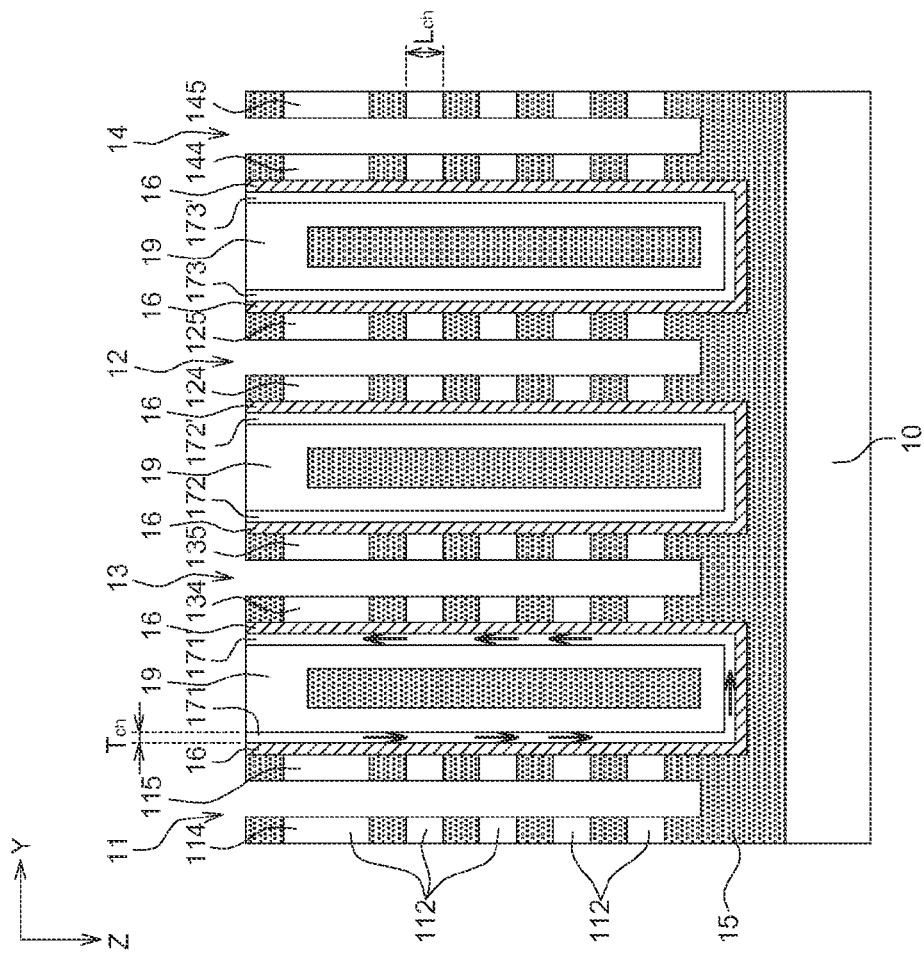
FIG. 11A is a cross-sectional view of another 3D memory structure of the embodiment.
Figure 11B:
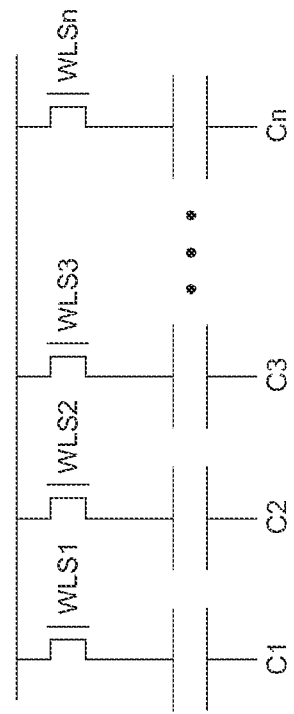
FIG. 11B simply illustrates the capacitance of FIG. 11A.

FIG. 10A is a cross-sectional view of the 3D memory structure of the embodiment, wherein the elements are identical to that in FIG. 1A and details are not redundantly repeated. FIG. 10B simply illustrates the capacitance of FIG. 10A. Since two adjacent unit cells share one gate, the capacitance of word line selector WLS1 is equal to the sum of C1 and C2, and the capacitance of word line selector WLS2 is equal to the sum of C3 and C4. However, the disclosure is not limited thereto. If the process can do, the shared gates of FIG. 10A could be cut to form two separated and independent portions, just like the construction of SSL and GSL. FIG. 11A is a cross-sectional view of another 3D memory structure of the embodiment. FIG. 11B simply illustrates the capacitance of FIG. 11A. As shown in FIG. 11A, each gate of each stacked structure includes two isolated parts electrically independent from each other.

It is noted that the structure arrangement as depicted in FIG. 1A could be appropriately adjusted and modified in the application of the 3D memory structure of the embodiment, to meet the requirements of application.

Figure 12:
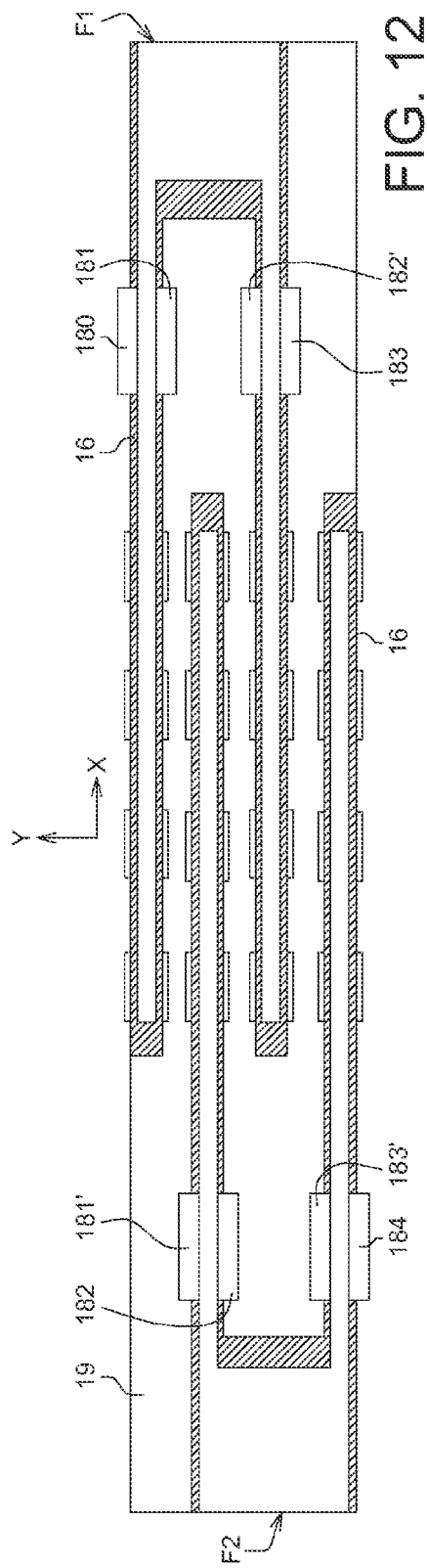
FIG. 12 is a top view of a chip applied with the 3D memory structure of the embodiment.

FIG. 12 is a top view of a chip applied with the 3D memory structure of the embodiment. Compared to FIG. 1A, the four stacked structures of the first finger-shaped stacked section F1 and the second finger-shaped stacked section F2 in the chip of FIG. 12 are extended along the +x/−x direction, and a plurality of unit cells could be formed as illustrated above. Also, word line selectors (WLS) 180/181/181'/182/182'/183/183'/184 are disposed in the chip of FIG. 12. Similarly, the word line selectors are selected by pairs during operation, and the word lines within the WLS region are controlled by the corresponding pair of WLS. The layer contact lines are disposed at the sides of the first finger-shaped stacked section F1 and the second finger-shaped stacked section F2, as shown in FIG. 6A.

Figure 13:
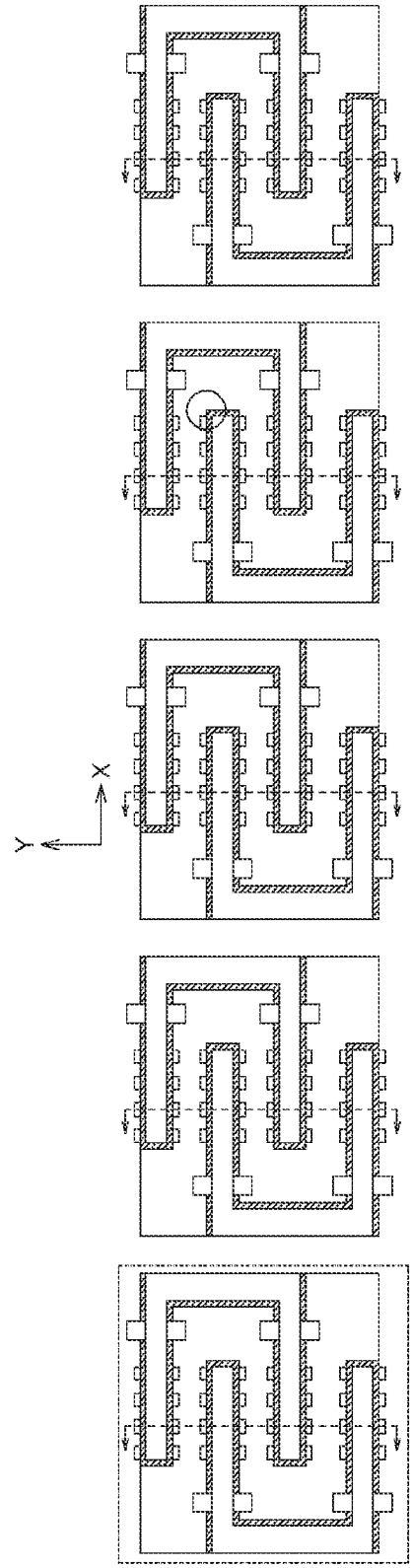
FIG. 13 is a top view of another chip applied with the 3D memory structure of the embodiment.
Figure 14:
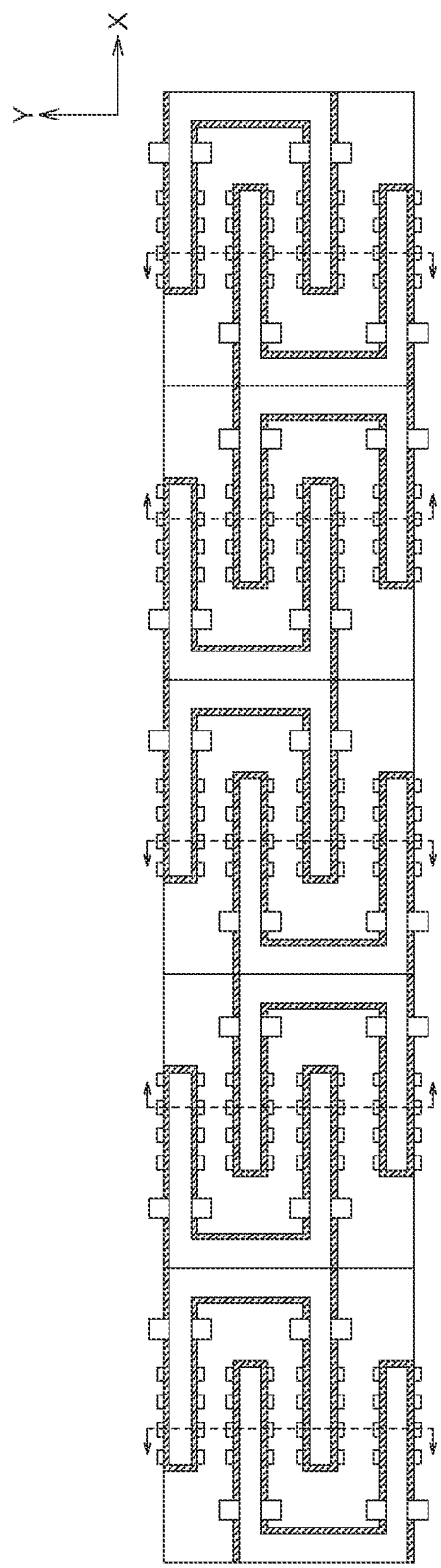
FIG. 14 is a top view of a further chip applied with the 3D memory structure of the embodiment.

FIG. 13 is a top view of another chip applied with the 3D memory structure of the embodiment. As shown in FIG. 13, several 3D memory structures as depicted in FIG. 1A are arranged as one row, and the 3D memory structures are controlled independently. FIG. 14 is a top view of a further chip applied with the 3D memory structure of the embodiment. The difference between the chips of FIG. 13 and FIG. 14 is the arrangement of the finger-shaped stacked sections. As shown in FIG. 13, the first and second finger-shaped stacked sections F1 and F2 in each 3D memory structures are oppositely staggered in the same way. As shown in FIG. 14, two first finger-shaped stacked sections F1 in the adjacent 3D memory structures are set as a mirroring arrangement, and so are the two second finger-shaped stacked sections F2 in the adjacent 3D memory structures. In FIG. 13 and FIG. 14, several layer contact lines are formed (as depicted in FIG. 6A) in each of the 3D memory structures. Also, the layer contacts of FIG. 13 and FIG. 14 could be shared by adjacent 3D memory structures, so as to improve the array efficiency. Although RC delay of the chip of FIG. 13 is ⅕ of the chip of FIG. 12, the chip of FIG. 13 requires more room for disposing more layer contact lines and more layer decoders so as to loss some array efficiency. Also, higher density unit cells could be constructed in the chip of FIG. 12. That is always a trade off between bit cost and produce performance. Accordingly, the 3D memory structure of the embodiment (as depicted in FIG. 1A) could be appropriately adjusted and modified, by considering the balances between the chip size and electrical performance, in order to meet the requirements of the application.

<Related Method for Operating 3D Memory Structure>

Figure 15:
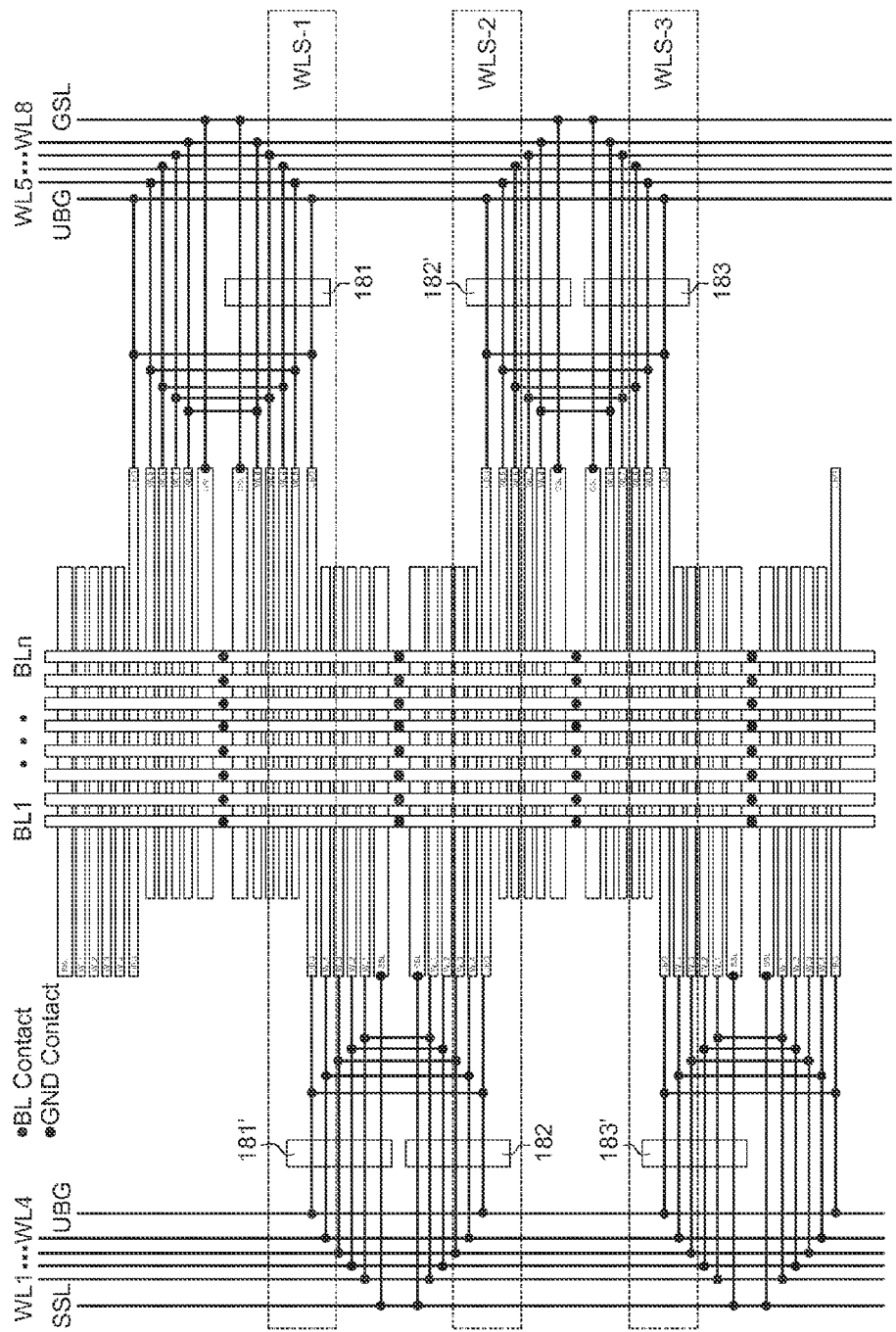
FIG. 15 shows a 2D flat structure derived from the 3D stacked memory structure as shown in FIG. 4A.

A method for operating the 3D stacked memory structure of the embodiment is demonstrated below with reference to the accompanying drawings. However, other operation methods could be applicable, and not limited to the methods described herein. Please also refer to FIGS. 1A, 1B, 4A, 6A and 6C for details of the 3D stacked memory structure of the embodiment. FIG. 15 shows a 2D flat structure derived from the 3D stacked memory structure as shown in FIG. 4A. It is important to know that the 2D flat structure of FIG. 15 is not a cross-sectional view of the 3D stacked memory structure, and the those elements in FIG. 15 are presented for the purpose of clearly showing the pieces and connections of the elements.

As shown in FIG. 15, the word lines WL1-WL8 and the bit lines BL1-BLn are disposed perpendicularly. The word lines WL1-WL4 and WL5-WL8 are disposed at two stacked structures, wherein the word lines WL1 and WL8 are at the same level of WL layer, the word lines WL2 and WL7 are at the same level of WL layer, the word lines WL3 and WL6 are at the same level of WL layer, and the word lines WL4 and WL5 are at the same level of WL layer. There are bottom gate (UBG) and two selection lines SSL or GSL respectively formed under and above the word lines. The first to n-th ultra-thin U-shaped channels formed between the adjacent stacked structures communicate the SSL, the word lines WL1-WL4, WL5-WL8 and GSL. A pair of the word line selectors 181 and 181' are corresponding to the WLS-1 region, a pair of the word line selectors 182 and 182' are corresponding to the WLS-2 region, a pair of the word line selectors 183 and 183' are corresponding to the WLS-3 region. In operation, the word lines of the WLS region are selected by selecting the corresponding pair of the word line selectors. For example, if the word line selectors 182 and 182' are selected, the n of ultra-thin U-shaped channels in the WLS-2 region are selected.

Figure 16A:
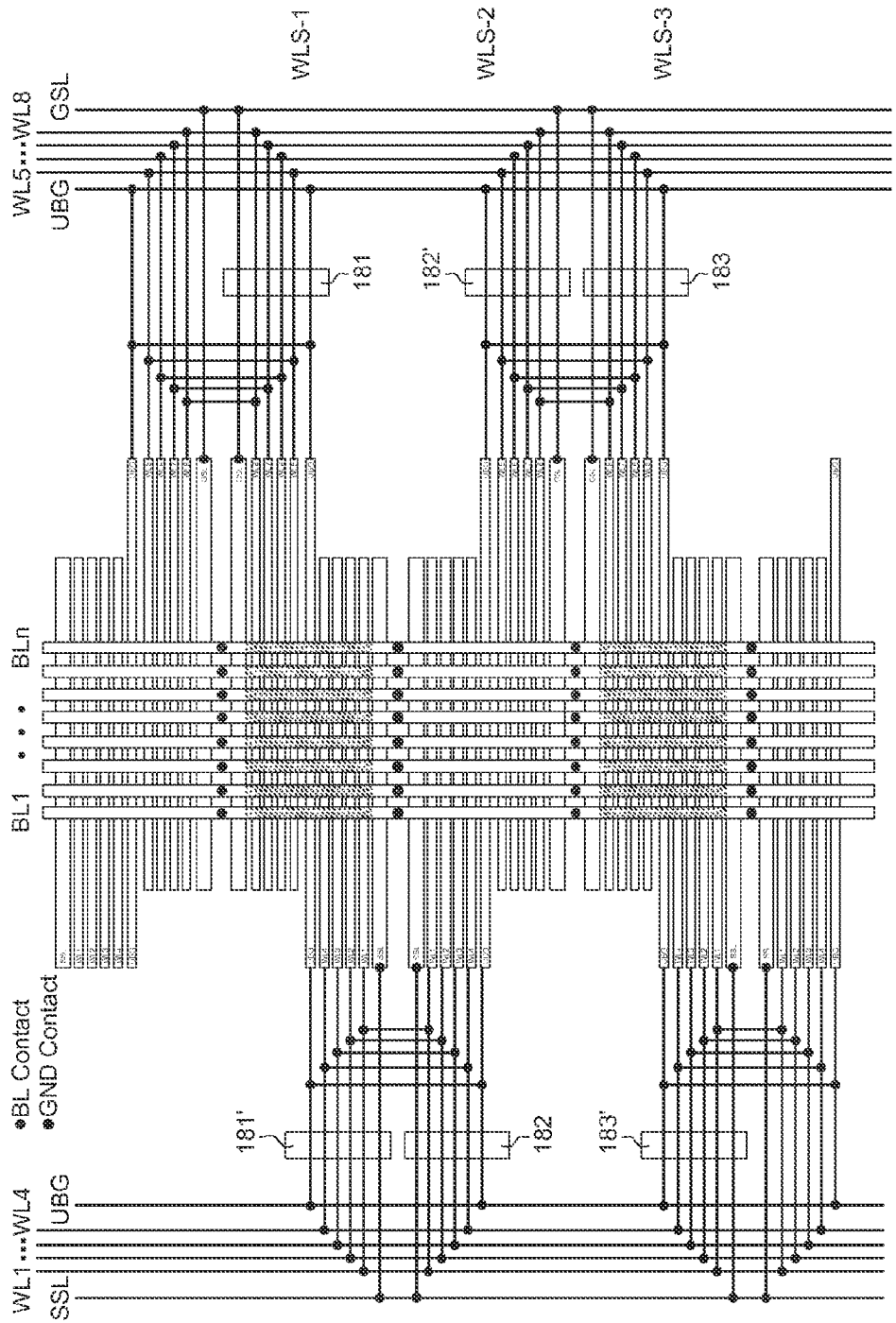
FIG. 16A~FIG. 16C illustrate a method for operating 3D stacked memory structure, which are depicted as the 2D flat structure of FIG. 15.
Figure 16B:
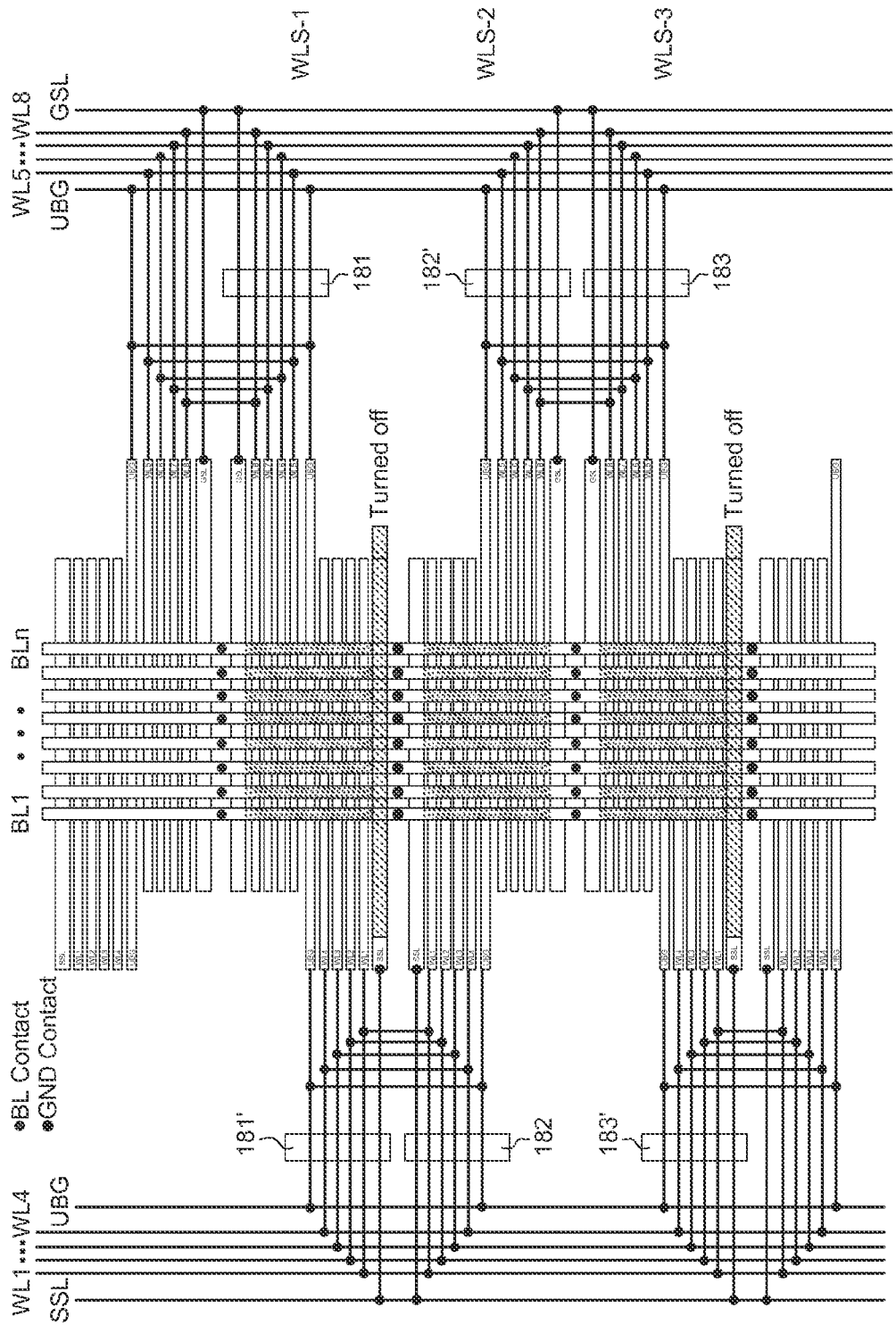
Figure 16C:
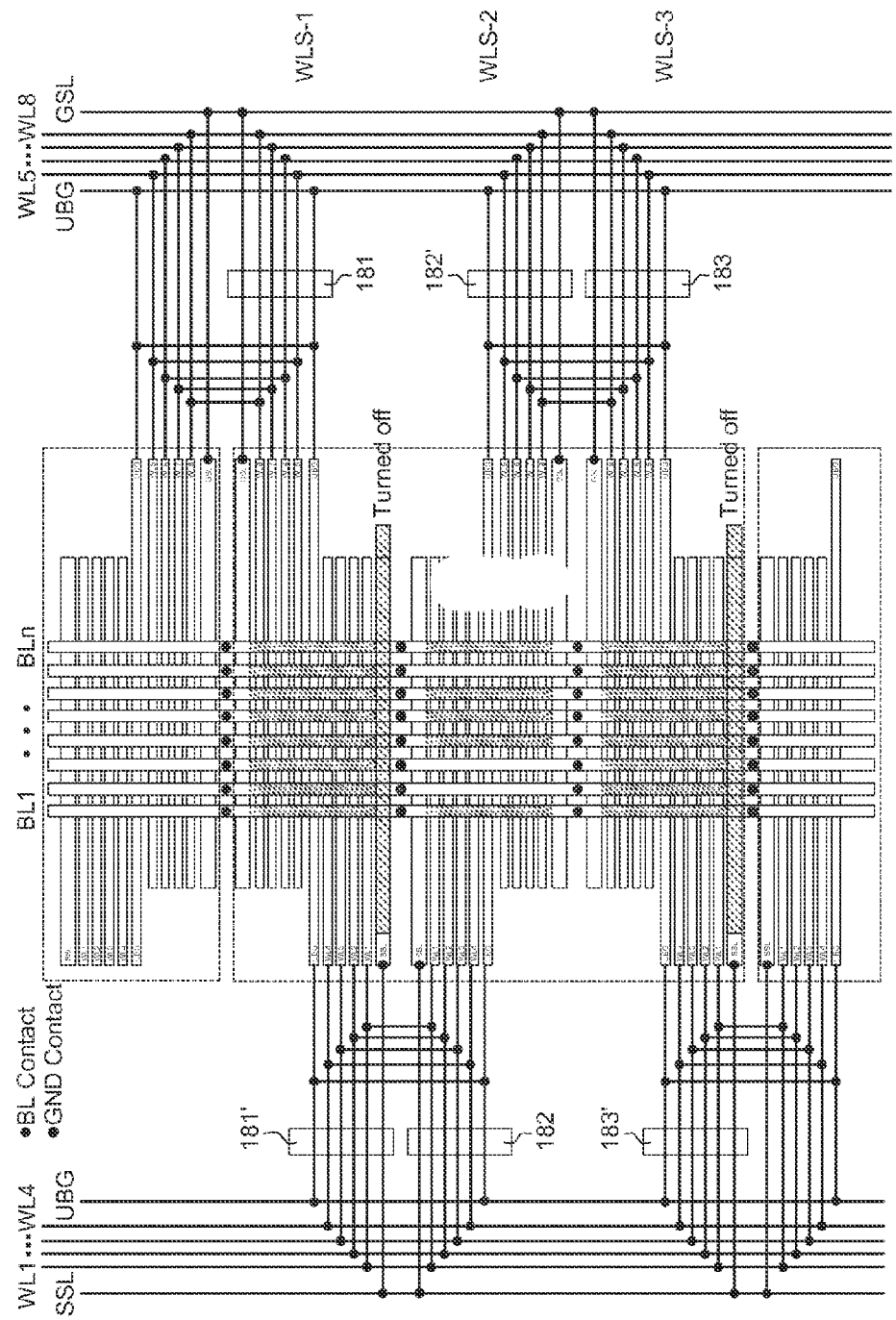

FIG. 16A~FIG. 16C illustrate a method for operating 3D stacked memory structure, which are depicted as the 2D flat structure of FIG. 15. It is assumed that the word line WL5 in the WLS-2 region would be programmed. In this case, the WLS-2 region is a selected WLS region to-be-programmed.

First, all of non-selected WLS regions such as WLS-1 and WLS-3 regions are turned on (by applying Vhigh, such as 25V), and the selected WLS region to-be-programmed such as WLS-2 is turned off. A pass voltage (Vpass, such as 10V, Vpass>threshold voltage, Vt) is applied to all of the word lines and bottom gates of the non-selected WLS regions WLS-1 and WLS-3, 0V and a power supply voltage (Vcc) are respectively applied to the GSLs (GSL closed) and SSLs (SSL opened), and Vcc is applied to all the bit lines BL1-BLn. Then, the SSLs (SSL=0V) in the non-selected WLS regions WLS-1 and WLS-3, are turned off, so that all of bit lines of the non-selected WLS regions WLS-1 and WLS-3 are charged to an initial voltage, wherein the initial voltage is equal to a difference between the Vcc and the Vt (Vcc−Vt), as shown in FIG. 16A.

Then, the non-selected WLS regions WLS-1 and WLS-3 are turned off (WLS-1/WLS-3=0V), and the SSLs in the non-selected WLS regions WLS-1 and WLS-3 are applied with 0V. The selected WLS region WLS-2 is turned on (by applying Vhigh, such as 25V). A pass voltage (Vpass, such as 10V, Vpass>Vt) is applied to all of the word lines and bottom gates of the selected WLS region WLS-2, 0V and Vcc are respectively applied to the GSLs and SSLs, and Vcc is applied to all the bit lines BL1-BLn. Therefore, all of bit lines of the selected WLS regions are charged to the voltage of Vcc−Vt before SSL be turned off, as shown in FIG. 16B.

It is assumed that the bit lines BL2/BL3/BL7 are selected to program. 0V is applied to the selected bit lines BL2/BL3/BL7, thereby releasing charges in the selected bit lines of the selected WLS region WLS-2, and floating non non-selected bit lines at voltage of Vcc−Vt. A high voltage (ex: 25V) is applied to the selected word line in the selected WLS region (ex WL5 in WLS-2), and a Vpass (ex: 10V) is applied to non-selected word lines, as shown in FIG. 16C. While the selected bit lines are 0V, the floating channels of the non-selected bit lines would be self-boosted to higher voltage. Meanwhile, the voltage differences (25V-0V) between the selected WL5 and selected BL2/BL3/BL7 are larger than that between the selected WL5 and non-selected BL1/BL4/BL5/BL6/BL8. Afterward, the selected WL5 and selected BL2/BL3/BL7 in the WLS-2 region could be programmed by FN (Fowler-Nordheim) Tunneling effect. Since the non-selected WLS-1 and WLS-3 regions are turned off during programming the selected WLS-2 region, the selected WLS-2 region would not disturbed by the neighbor regions.

It is noted that the operating method as described above are provided for illustration, and people who known by the art could adjust and modify the steps based on the knowledge or the steps above, so as to perform the operation of programming, reading and erasing. The disclosure is not limited to the operation method disclosed above, and each voltage value is for exemplification, not for limitation, and could be adjusted and changed based on the operation needs of the practical application.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) memory structure, comprising:
    a plurality of stacked structures vertically formed on a substrate, each stacked structure comprising:
        a bottom gate, wherein the bottom gates of the stacked structures are electrically connected to each other;
        a plurality of gates and a plurality of gate insulators alternately stacked on the bottom gate; and
        two selection lines formed above the gates and spaced apart form each other, and the selection lines being independently controlled, wherein the gate insulator fills between the selection lines, between the gate and the selection lines and forms on top of the selection lines for insulation;
    a plurality of charge trapping multilayers, formed outsides of the stacked structures and extending to the bottom gates;
    a plurality of ultra-thin channels formed outsides of the charge trapping multilayers and lined between the adjacent stacked structures; and
    a dielectric layer, formed between the ultra-thin channels and between the stacked structures.

2. The 3D memory structure according to claim 1, wherein the two selection lines of each stacked structure are two string selection lines (SSLs) or two ground selection lines (GSLs), and the charge trapping multilayers between the adjacent stacked structures are electrically connected to one of string selection lines and one of the ground selection lines.

3. The 3D memory structure according to claim 1, wherein the ultra-thin channels between the adjacent stacked structures are extended downwardly to form an ultra-thin U-shaped channel lined between the adjacent stacked structures.

4. The 3D memory structure according to claim 1, wherein the ultra-thin channels between the adjacent stacked structures are extended downwardly to form an ultra-thin U-shaped channel, and the ultra-thin U-shaped channels are arranged as a matrix with m rows and n columns in a xy-plane.

5. The 3D memory structure according to claim 1, further comprising a plurality of layer contacts electrically connected to the bottom gate, the gates and the selection lines correspondingly.

6. The 3D memory structure according to claim 1, wherein two adjacent unit cells share one of the gates.

7. The 3D memory structure according to claim 1, wherein each gate of each stacked structure comprises two isolated parts electrically independent from each other.

8. The 3D memory structure according to claim 1, wherein the stacked structures are arranged as staggered fingers in a xy-plane.

9. A 3D memory structure, comprising:
    a first finger-shaped stacked section and a second finger-shaped stacked section vertically formed on a substrate and staggered oppositely, the first finger-shaped stacked section comprising a first stacked structure and a second stacked structure extending along −x direction in a xy-plane, the second finger-shaped stacked section comprising a third stacked structure and a fourth stacked structure extending along +x direction in the xy-plane, the third stacked structure extending between the first and the second stacked structures, and each of the first to fourth stacked structures comprising a bottom gate, a plurality of gates and gate insulators alternately stacked on the bottom gate, and two selection lines independently formed above the gates along z direction, wherein the bottom gates of the first to fourth stacked structures are electrically connected to each other;
    a first charge trapping multilayer and a second charge trapping multilayer respectively formed outsides of the first and the second finger-shaped stacked sections, and extending to the bottom gates between adjacent stacked structures of the first to fourth stacked structures along z direction;
    a plurality of ultra-thin channels set apart at outsides of the first and the second finger-shaped stacked sections and extending downwardly, and two of the ultra-thin channels between the opposite sides of adjacent stacked structures of the first to fourth stacked structures correspondingly forming an ultra-thin U-shaped channel;
    a plurality of word line selectors, respectively disposed at two sides of one end of each stacked structure and electrically connected to the first and the second charge trapping multilayers; and
    a dielectric layer, filling between the ultra-thin channels, outside the word line selectors and between the first and the second finger-shaped stacked sections;
    wherein the 3D memory structure has a plurality of unit cells, and each unit cell has one gate and one portion of the first and second charge trapping multilayers.

10. The 3D memory structure according to claim 9, wherein the two selection lines of each of the first to fourth stacked structures are two string selection lines (SSLs) or two ground selection lines (GSLs), and the first and the second charge trapping multilayers between adjacent stacked structures of the first to fourth stacked structures are electrically connected to one of string selection lines and one of the ground selection lines.

11. The 3D memory structure according to claim 9, further comprising a word line selector (WLS) region between two adjacent stacked structures, and each WLS region has several of the ultra-thin U-shaped channels and correspondingly controlled by a pair of the word line selectors.

12. The 3D memory structure according to claim 9, wherein the ultra-thin U-shaped channels are lined between the opposite sides of adjacent stacked structures of the first to fourth stacked structures, and the ultra-thin U-shaped channels are arranged as a matrix with m rows and n columns in the xy-plane.

13. The 3D memory structure according to claim 9, wherein the word line (WL) selectors are a plurality of single side island WL selectors, and each of the single side island WL selectors is formed at one side of the end of each of the first to fourth stacked structures and extends to a bottom of the stacked structure, and a top of the single side island WL selector is coupled to the corresponding first or second charge trapping multilayer.

14. The 3D memory structure according to claim 9, wherein two adjacent unit cells share one of the gates.

15. The 3D memory structure according to claim 9, wherein each gate of each of the first to fourth stacked structures comprises two isolated parts electrically independent from each other.

16. The 3D memory structure according to claim 9, further comprising a shielding layer formed in the dielectric layer and extending between the ultra-thin channels of the adjacent first and third stacked structures, of the adjacent second and third stacked structures, of the adjacent third and fourth stacked structures.

17. The 3D memory structure according to claim 9, wherein the first and the second finger-shaped stacked sections of the adjacent 3D memory structures are oppositely staggered in the same way.

18. A method for operating 3D memory structure, comprising:
provinding a D memory structure comprising:
a plurality of stacked structures vertically formed on a substrate, and each stacked structure having a bottom gate, a plurality of word lines and a plurality of gate insulators alternately stacked on the bottom gate, and two selection lines independently formed above the word lines and spaced apart form each other, wherein one of the adjacent stacked structures has a string selection line (SSL) and the other has a ground selection line (GSL);
a plurality of charge trapping multilayers formed outsides of the stacked structures and extending to the bottom gates;
a plurality of ultra-thin U-shaped channels formed outsides of the charge trapping multilayers and lined between the adjacent stacked structures, and a word line selector (WLS) region defined between two adjacent stacked structures and comprising several of the ultra-thin U-shaped channels and a pair of word line selectors, wherein the pair of word line selectors are disposed in front and rear of the ultra-thin U-shaped channels for controlling the corresponding ultra-thin U-shaped channels; and
a plurality of bit lines disposed above the selection lines and perpendicular to the word lines;
turning off a selected WLS region to-be-programmed and turning on all of non-selected WLS regions, wherein the ultra-thin U-shaped channels of the WLS region are turned on or turned off by turning on or off the pair of word line selectors;
turning on the SSLs and turning off the GSLs of the non-selected WLS regions, charging all of bit lines of the non-selected WLS regions to an initial voltage, and then turning off the SSLs of the non-selected WLS regions;
turning off the non-selected WLS regions and turning on the selected WLS region through the corresponding pairs of word line selectors;
charging all of bit lines of the selected WLS region to the initial voltage;
releasing charges in one or more of the selected bit lines of the selected WLS region, and applying a high voltage to a selected word line and a passing voltage (Vpass) to non-selected word lines, so that channels of the non-selected bit lines are self-boosted to higher voltage; and
programming one or more selected bits.

19. The method for operating 3D memory structure according to claim 18, in step of turning on the SSLs of the non-selected WLS regions, the passing voltage (Vpass) is applied to all of the word lines and bottom gates of the non-selected WLS regions, 0V and a power supply voltage (Vcc) are respectively applied to the GSLs and SSLs, so as to charge all of bit lines of the non-selected WLS regions to the initial voltage, wherein the initial voltage is equal to a difference between the Vcc and a threshold voltage (Vt).

20. The method for operating 3D memory structure according to claim 18, in step of charging all of bit lines of the selected WLS region to the initial voltage, the passing voltage (Vpass) is applied to all of the word lines and bottom gates of the selected WLS region, 0V and a power supply voltage (Vcc) are respectively applied to the GSLs and SSLs, so as to charge all of bit lines of the selected WLS regions to the initial voltage, wherein the initial voltage is equal to a difference between the Vcc and a threshold voltage (Vt).

* * * * *